(12) United States Patent
O'Connor

(10) Patent No.: US 10,726,995 B2
(45) Date of Patent: Jul. 28, 2020

(54) DIELECTRIC STRUCTURES FOR ELECTRICAL INSULATION WITH VACUUM OR GAS

(71) Applicant: Kevin Andrew O'Connor, Orland Park, IL (US)

(72) Inventor: Kevin Andrew O'Connor, Orland Park, IL (US)

( * ) Notice: Subject to any disclaimer, the term of this patent is extended or adjusted under 35 U.S.C. 154(b) by 0 days.

(21) Appl. No.: 16/576,438

(22) Filed: Sep. 19, 2019

(65) Prior Publication Data

US 2020/0090866 A1 Mar. 19, 2020

Related U.S. Application Data

(60) Provisional application No. 62/733,174, filed on Sep. 19, 2018.

(51) Int. Cl.
| | |
|---|---|
| *H01G 4/20* | (2006.01) |
| *H01G 4/10* | (2006.01) |
| *H01G 4/02* | (2006.01) |
| *H01B 3/16* | (2006.01) |

(52) U.S. Cl.
CPC ............... *H01G 4/20* (2013.01); *H01B 3/16* (2013.01); *H01G 4/02* (2013.01); *H01G 4/10* (2013.01)

(58) Field of Classification Search
CPC ................... H01G 4/02; H01G 4/20
See application file for complete search history.

(56) References Cited

U.S. PATENT DOCUMENTS

| 9,870,875 B1* | 1/2018 | Phillips ................. H01G 11/62 |
| 2004/0195693 A1 | 10/2004 | Kloster et al. |
| 2008/0185728 A1 | 8/2008 | Clevenger et al. |
| 2011/0017494 A1 | 1/2011 | Asokan et al. |

OTHER PUBLICATIONS

International Search Report and Written Opinion for PCT/US19/151974 dated Dec. 18, 2019.

\* cited by examiner

*Primary Examiner* — Eric W Thomas
(74) *Attorney, Agent, or Firm* — Husch Blackwell LLP

(57) ABSTRACT

A dielectric structure including solid dielectric regions incorporating a plurality of regions of vacuum or gas is provided. The dielectric constant of the regions of solid dielectrics can have a dielectric constant greater than 4. Each of the plurality of regions of vacuum or gas or the regions of solid dielectrics may be anisotropic with an aspect ratio of at least four. The smallest average dimension of a plurality of regions of vacuum or gas and/or solid dielectrics can have a length of less than 1 micron. The dielectric structure may have a higher electrical energy density in the regions of vacuum or gas than in the solid matrix. One or more electrodes of the capacitive structure can be coated with a solid insulating layer without an interface between a region of vacuum or gas and electrode.

22 Claims, 29 Drawing Sheets

DIELECTRIC STRUCTURES FOR ELECTRICAL INSULATION WITH VACUUM OR GAS

CROSS-REFERENCE TO RELATED APPLICATIONS

This application claims priority to U.S. Provisional Patent Application Ser. No. 62/733,174, filed on Sep. 19, 2018, entitled "CAPACITIVE STRUCTURES FOR HIGH ELECTRICAL ENERGY DENSITY," the entire disclosure of which is incorporated herein by reference.

FIELD

The present invention is generally directed to composites for electrical insulation, including dielectrics for capacitors, circuit substrates, transmission lines and cables, semiconductor devices, and the like.

BACKGROUND

Dielectrics provide electrical insulation to prevent undesired current flow in electrical equipment, including capacitors, transmission lines, circuit substrates, semiconductor devices, mechanical supports, and other applications. Dielectrics are limited to operation at electric fields at or below their dielectric strength, the electric field level at which the dielectric fails to prevent current flow below an acceptable level. The maximum electric field at which a dielectric can reliably be operated is dependent on the applied voltage, the thickness of the dielectric, and the spatial relationship of conductors and dielectrics in the system, among other factors. Since the dielectric strength is limited by the material properties, manufacturing quality, and operating conditions, the thickness of the dielectric often must be increased to enable operation at higher voltage. As the thickness of the dielectric increases to support higher voltage operation, the size of the devices, such as capacitors and transmission lines, increases. In the case of capacitors, increasing the dielectric thickness reduces the capacitance density, defined as the capacitance per unit area, and thus requires a larger capacitor area to obtain an equivalent total capacitance as a capacitor incorporating a thinner dielectric. The additional material required to increase both the thickness and area of the dielectric causes the volume and weight of the dielectric and overall device to be much larger. Since many applications for capacitors and other electrical devices incorporating dielectrics would benefit from smaller and/or lighter components, materials capable of operating at higher electric field are needed to reduce the size and weight of the components incorporating the dielectrics. The electrical energy density, defined as the energy stored in a dielectric per unit volume or per unit mass, is commonly used as a metric to evaluate the size and/or weight of dielectrics based on their material properties. By increasing a dielectric's electrical energy density, components incorporating that dielectric can often be made smaller and lighter.

The electrical energy density, $W_e$ [J/m$^3$], can be calculated for a medium with a relative permittivity, which is commonly referred to as the dielectric constant, $\varepsilon_r$, in an electric field, E [V/m], by the following equation. The permittivity of free space, $\varepsilon_0$ [F/m], is approximately 8.85×10$^{-12}$ F/m.

$$W_e = \frac{1}{2}\varepsilon_0\varepsilon_r E^2$$

The electrical energy density scales with the square of the electric field and linearly with the dielectric constant. Therefore, increasing the operating electric field, which is limited by the dielectric strength of the medium, and/or the dielectric constant, which is dependent on the dielectric medium and is often a function of the operating temperature, frequency, and electric field, will increase the electrical energy density. While many efforts to increase the electrical energy density have sought to increase both the dielectric constant and the dielectric strength, and thus operating electric field, increasing the dielectric strength of a dielectric medium to increase the operating electric field can provide much more significant gains in electrical energy density due to the squared term.

Electrostatic capacitors store energy in an electric field. The term electrostatic capacitor used here is intended to differentiate from electric double layer capacitors and should be understood to include devices used with an alternating current (AC) or transient signal as well as direct current (DC). While capacitors have conventionally used dielectrics to separate the positive and negative charges of a capacitor, electric double layer capacitors, which are often called supercapacitors or ultracapacitors, do not typically have a dielectric separating the charges. Rather, conducting electrolyte and electrodes are in direct contact, and charges are not transferred across the interface unless the applied voltage is above a threshold voltage of a few volts. Thus, while the capacitance density and energy density of electric double layer capacitors is typically greater than those of electrostatic capacitors, the voltage of electric double layer capacitors is limited. While electric double layer capacitors can be arranged in series to create assemblies with higher operating voltage, either the capacitance of each electric double layer capacitor in the series stack must be approximately equal to evenly distribute the voltage across each element of the assembly or additional voltage control hardware must be used to prevent any individual capacitor from operating at too high of voltage. Thus, electric double layer capacitors are not suitable for providing high energy density in many high voltage applications.

Capacitors capable of operating at higher voltages than electric double layer capacitors (i.e., electrostatic capacitors) typically have a much lower capacitance density and energy density than electric double layer capacitors. There is a need for improvements in the field of electrostatic capacitors to increase energy density and power density while maintaining or improving capacitance density, and thus improvements to the dielectrics in electrostatic capacitors are needed. There are several other important performance factors related to dielectrics for electrostatic capacitors and other applications that can also be improved with new dielectric materials. First, many dielectric applications require both the capability to withstand high and low temperature extremes, temperature cycling, and to have a small variation in dielectric properties with respect to temperature. Second, it is also often critical for there to be minimal variation of the dielectric properties with respect to the applied voltage/operating electric field in the dielectric or other operational or environmental factors. For example, to remain within specification for certain applications, capacitor dielectrics must not change more than a predetermined percentage from their standard value over the range of voltages, frequencies, and temperatures of use. Solid and liquid dielectrics can have large variation due to effects of voltage/electric field, frequency, and temperature due to the dependence of the dielectric constant on these parameters. Conventional dielectrics with high dielectric constants, such as ferroelectrics, often have large variance with environmental and operating variables. In the case of capacitors, stability of the capacitance and voltage rating with respect to temperature and applied voltage would greatly expand the applicability of capacitors with high energy density storage capabilities. Third, many AC and radio frequency (RF) applications require low dielectric losses to operate efficiently at high frequencies. Some capacitors and cables operate with low-loss dielectrics based on foams produced with low dielectric constant polymers (e.g. polyethylene or polypropylene with $\varepsilon_r<4$), or simply gas or vacuum as the electrical insulator. However, these low-loss dielectrics have poor dielectric strength due to their implementation, limiting their use in devices for high electric field operation for high energy and power density. Fourth, many applications require improved reliability, which typically requires derating of the operating conditions (e.g., operating electric field in the dielectric of a capacitor) from the maximum capability of the dielectric to enable a long operating lifetime. Dielectrics with a higher dielectric strength can be operated with a larger derating factor, thus increasing lifetime and reliability, while operating at the same electric fields of other dielectrics with lower derating factors. Fifth, to achieve operation at very high electric fields, film capacitors, which are commonly made with polymer film dielectrics, have been developed with the ability to be operational after one or more failure events within the dielectric. This capability, commonly referred to as self-clearing or self-healing, enables operation beyond the limitations of the weakest points of the dielectric, where a material defect or contamination would otherwise cause premature failure of the entire device. This self-clearing or self-healing property is enabled both by using very thin electrodes and the appropriate dielectric. The dielectric material is a critical factor in determining the self-clearing or self-healing capability, and some dielectrics have been found to be incompatible with the methods used for self-clearing. Due to the known shortcomings of dielectrics known in the art, a novel approach to dielectric materials is required to satisfy the many requirements on dielectrics over the range of operating conditions.

Materials for High Energy Density Capacitors—Conventional high energy density capacitors are based on solid dielectrics of polymers, ceramics, or composites of polymers and ceramics. In some cases, liquid dielectrics, such as insulating oils, are used in addition to a solid dielectric. Significant efforts have been made in recent decades to mature thin-film polymer manufacturing for high energy density capacitors. Biaxially oriented polypropylene (BOPP) is commercially available in films with thicknesses on the order of microns that can be operated at field strengths on the order of 300 MV/m. These thin-film polymers are routinely used in practice, and the energy density is particularly high when made with self-healing electrodes capable of isolating points of failure in the dielectric through the vaporization of the electrode around the failure point with the surge in current at the fault. These polymer-based thin films are limited in the range of operating temperature due to the properties of the polymer. In particular, the polymer will soften or otherwise degrade at high temperature such that the dielectric strength and energy density are reduced. The polymer properties are also dependent on the glass transition temperature, which can affect low temperature performance. Other acrylic-based polymers with higher operating temperature have been commercialized at thicknesses of less than 1 um. While the small thickness and different polymer chemistry are improvements from other polymer capacitor technologies, the technology has reached its limits with operation demonstrated at near 1,000 MV/m for sub-micron polymer thicknesses.

Other approaches to achieve a high capacitive energy density use high dielectric constant materials. Some polymers, such as poly vinylidene fluoride (PVDF) and other polymers with polar groups, can have dielectric constants greater than 10. However, the dielectric strength of these polar polymers is typically much lower than the previously discussed BOPP and acrylic-based thin-film polymers. The polar groups also cause significant losses under AC signals, which make them unsuitable for many applications. Ceramic materials with dielectric constants ranging up to several thousand have been used in capacitors. The ceramics with the highest dielectric constants are ferroelectrics such as barium titanate and strontium titanate. While these ceramics have many applications, their use in high energy density capacitors is limited due to ferroelectric saturation, which causes a large decrease in the dielectric constant with increased voltage. These perovskite ceramics also exhibit high dielectric losses at RF frequencies and can have significant variation of properties with respect to temperature. Other ceramics are applied in high energy density capacitors. Aluminum electrolytic capacitors operate the aluminum oxide dielectric layer at fields up to 800 MV/m. With a dielectric constant of approximately 10, a field strength of 800 MV/m corresponds to 28.3 J/cm$^3$, though the operating field and energy density is typically lower. Tantalum capacitors, with a dielectric constant of 25, are also used in high energy density applications but typically at lower field strengths than aluminum oxide. While these ceramics are at the state of the art of commercially available capacitors, the opportunities for increases in energy density are limited as the ceramics are already operated near their theoretical breakdown limit (1.38 GV/m for trigonal aluminum oxide and 370 MV/m for cubic tantalum oxide). Another area of active work for high energy density capacitors is polymer-ceramic composites. These composites of ceramic particles in a polymer matrix typically exhibit a higher dielectric constant than the unloaded polymer and a higher dielectric strength than the ceramic of the same thickness of the composite. However, the dielectric strength is often determined by the dielectric strength of the polymer, so the polymer-ceramic composite approach has little or no advantage to polymer multi-layer capacitors in which the polymer layer is on the sub-micron scale as is done in acrylic-based polymer multi-layer capacitors.

SUMMARY

Embodiments of the present invention include novel structures and assemblies to enable high electrical energy density operation in vacuum and gases, which are electrically equivalent to vacuum in the structures of the invention. While the dielectric constant of vacuum is 1 and the dielectric constants of gases are only slightly larger than one, embodiments of the invention present a means of achieving higher electrical energy density than that available in conventional dielectrics with higher dielectric constants. This is accomplished by designing solid-vacuum or solid-gas composite structures that address multiple breakdown mechanisms while also concentrating the electric field in the vacuum or vacuum-equivalent gas portions of the structure. Additional benefits of the invented materials are operation at low and high temperature extremes, larger derating factor for operation at a given electric field, self-healing or self-clearing capability, and low dependence of the dielectric properties and energy density with respect to temperature, applied voltage, and frequency.

In an aspect, an article may comprise a dielectric structure. The dielectric structure includes one or more regions of at least one solid material that has a dielectric constant greater than four and a plurality of regions of vacuum or gas. At least one region of the one or more solid material regions has a first average particle dimension ($d_{maj}$) and a second average particle dimension ($d_{min}$). Moreover, at least one region of vacuum or gas has a first average particle dimension ($d'_{maj}$) and a second average particle dimension ($d'_{min}$). An aspect ratio of $d_{maj}$ to $d_{min}$ for the at least one solid material region is equal to or greater than four and/or an aspect ratio of $d'_{maj}$ to $d'_{min}$ for the at least one vacuum or gas region is equal to or greater than four. The plurality of regions of vacuum or gas are dispersed throughout the one or more regions of at least one solid material such that, upon application of an electric field to the dielectric structure, the average electric field in the one or more regions of at least one solid material is less than the average electric field in the plurality of regions of vacuum or gas.

Other and further objects of the invention, together with the features of novelty appurtenant thereto, will appear in the course of the following description.

BRIEF DESCRIPTION OF THE DRAWINGS

In the accompanying drawings, which form a part of the specification and are to be read in conjunction therewith in which like reference numerals are used to indicate like or similar parts in the various views.

DETAILED DESCRIPTION

Figure 1:
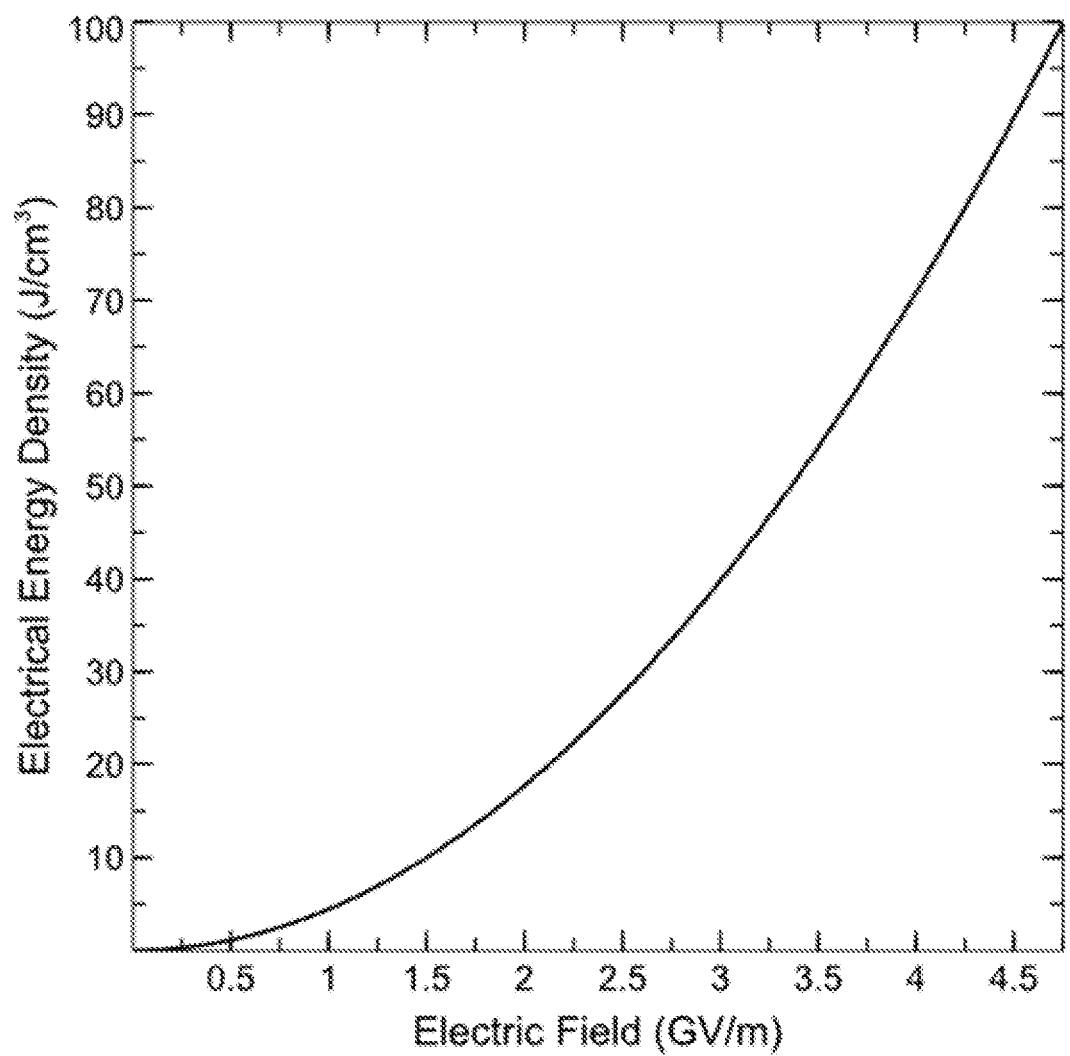
FIGS. 1 and 2 are plots of the electrical energy density in vacuum or gases in an electric field in accordance with embodiments of the present invention.

The invention will now be described with reference to the drawing figures, in which like reference numerals refer to like parts throughout. For purposes of clarity in illustrating the characteristics of the present invention, proportional relationships of the elements have not necessarily been maintained in the drawing figures. It will be appreciated that any dimensions included in the drawing figures are simply provided as examples and dimensions other than those provided therein are also within the scope of the invention.

The following detailed description of the invention references specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The present invention is defined by the appended claims and the description is, therefore, not to be taken in a limiting sense and shall not limit the scope of equivalents to which such claims are entitled.

Embodiments of the present invention include novel structures and assemblies to enable high electrical energy density operation in vacuum and gases, which are electrically equivalent to vacuum in the structures of the invention. While the dielectric constant of vacuum is 1 and the dielectric constants of gases are only slightly larger than one, embodiments of the invention present a means of achieving higher electrical energy density than that available in conventional dielectrics with higher dielectric constant. This is accomplished by designing solid-vacuum or solid-gas composite structures that address multiple breakdown mechanisms while also concentrating the electric field in the vacuum or vacuum-equivalent gas portions of the structure. Additional benefits of the invented materials are operation at low and high temperature extremes, larger derating factor for operation at a given electric field, self-healing or self-clearing capability, and low dependence of the dielectric properties and energy density with respect to temperature, applied voltage, and frequency.

Electric Field Levels Required for High Electrical Energy Density—The electrical energy density of a medium is dependent on both the dielectric constant and the operating electric field as previously described. For vacuum, the dielectric constant or relative permittivity is 1. For gases, the dielectric constant has a slight dependence on density but is effectively 1. Thus, to achieve high electrical energy density with vacuum or gases, the electric field must be higher than those used with conventional liquid or solid dielectrics.

FIG. 1 is a plot of the electrical energy density of vacuum or gases in an electric field up to 4.75 gigavolts per meter (GV/m) (GV/m is $1 \times 10^9$ volts per meter (V/m) or 1 volt per nanometer (V/nm)). At 1 GV/m, the electrical energy density is 4.43 Joules per cubic centimeter ($J/cm^3$). This energy density is higher than most packaged devices but lower than the energy density within the dielectric of currently available high energy density capacitors. When increasing the electric field to 2 GV/m, the electrical energy density is 17.7 $J/cm^3$. This energy density is comparable to the energy density within alumina films in high energy density aluminum electrolytic capacitors operating at field strengths of around 625 MV/m. At 2.6 GV/m the vacuum or gas dielectric can store energy at a density of 29.9 $J/cm^3$. This is higher than the alumina dielectrics operating at 800 MV/m, which has been cited as a maximum field for alumina in high energy density aluminum electrolytic capacitors (28.3 $J/cm^3$). When operating above 2.9 GV/m, the electrical energy density of vacuum or gas is superior to all other known dielectrics. As shown in FIG. 1, the electrical energy density increases rapidly such that an operating field of 4.75 GV/m in vacuum or gas stores nearly 100 $J/cm^3$.

Figure 2:
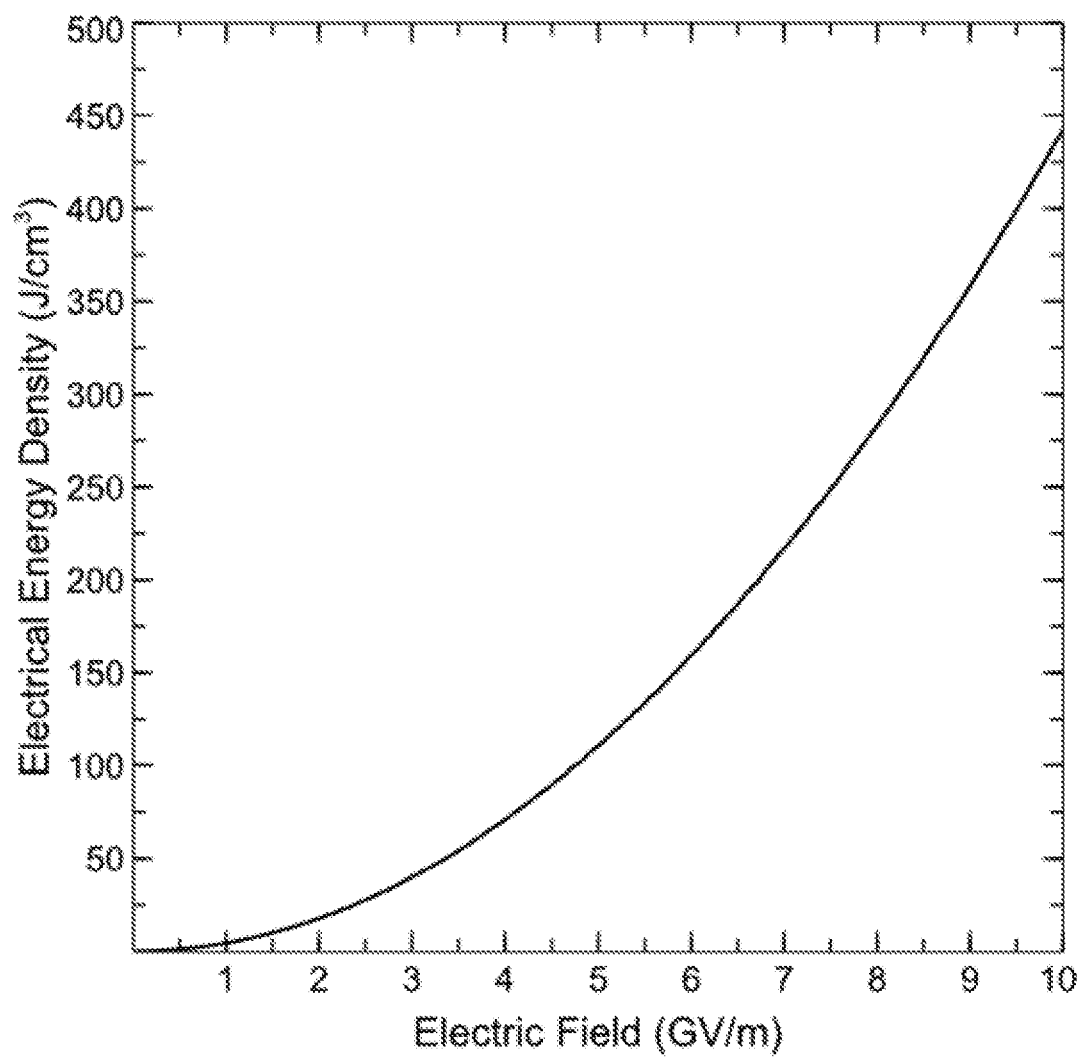

FIG. 2 is a plot of the electrical energy density in vacuum or gases in an electric field up to 10 GV/m. This plot illustrates that a vacuum or gas dielectric has the potential to store hundreds of joules per cubic centimeter at fields less than 10 GV/m. While achieving field strengths of this magnitude has challenges, it should be noted that these field strengths are several orders of magnitude less than the fundamental Schwinger limit.

Fundamental Limit to the Electric Field in Vacuum—While conventional dielectrics such as solids and liquids have limits to their dielectric strength related to the energy required to break the bonds forming those materials, there is not a comparable limitation in vacuum. To consider the fundamental limitations on the electric field that can exist within vacuum alone, effects of the anode and cathode of a capacitive arrangement and any supporting materials should be ignored. In classical quantum electrodynamics, the maximum electric field has been derived as the electric field at which the field becomes nonlinear due to the production of electron-positron pairs. The maximum field before nonlinearity, often referred to as the Schwinger Limit, has been derived to be approximately $1.32 \times 10^{18}$ V/m. This field strength is several orders of magnitude higher than those realized in conventional dielectrics (e.g., ~$1 \times 10^8$ to $1 \times 10^9$ in alumina) and those required for energy density beyond the state of the art using vacuum or gas as a dielectric (e.g., $1 \times 10^9$ to $1 \times 10^{10}$). Thus, the fundamental limits of breakdown of vacuum are not a limitation on achieving higher energy densities that those available in the state of the art. Proper design must be taken to address the causes of breakdown in vacuum gaps to achieve high energy density.

Vacuum Breakdown and the Paschen Curve—Vacuum or gas has previously not been used for high electrical energy density storage due to breakdown mechanisms that occur in conventional device structures. Vacuum breakdown is often described by the Paschen curve, which plots the voltage at breakdown vs. the product of gas pressure and electrode gap distance. A unique aspect of the Paschen curve is that it has a minimum breakdown voltage, and the breakdown voltage increases both for larger products of pressure and distance and smaller products of pressure and distance. To the right of the Paschen minimum, the increased breakdown voltage can be understood in multiple situations. If the electrode distance is increased, the average electric field in the gap is decreased for a given voltage. The voltage must be increased to achieve breakdown of the larger gap distance. For a constant gap spacing, increasing the gas pressure causes the mean free path between electron-neutral collisions to decrease. When a free electron is accelerated in the electric field, it reaches a lower peak energy before a collision occurs. If the peak energy of the electron is lower than that required to ionize an atom or molecule, an electron avalanche does not develop. The voltage and thus the electric field in the gap must be increased to enable the electron to attain enough energy to ionize additional atoms to produce an avalanche breakdown.

The increased voltage required to cause breakdown for products of the pressure and distance smaller than the Paschen minimum can be described by different mechanisms. At very low pressures, the mean free path for collisions is larger than the distance between electrodes, so an avalanche process does not develop into an arc discharge. The Paschen curve at values of the product of pressure and distance smaller than the Paschen minimum are often displayed as increasing to very high breakdown voltages. However, the data used to produce those curves is often generated by keeping the gap distance relatively large (i.e., on the order of 1 mm), and decreasing the gas pressure to achieve very low products of pressure and distance. At very small distances, other effects can be dominant that limit the increase of the breakdown voltage as shown on the Paschen curve.

Deviation from the Paschen Curve—Field emission of electrons from the cathode provides a source of electrons into the gap. When few or no collisions of electrons and atoms or molecules occur in the gap, the electrons accelerate until they impact the anode. This electron transfer from cathode to anode produces a leakage current. While the leakage current alone may be acceptable from an operational standpoint, it can lead to larger discharges of the gap that constitute dielectric failure. These failures can occur for multiple reasons, and there is scientific debate about the mechanisms under different conditions. Field emission can be localized to very small areas of the electrode where high current density can cause heating. Explosive emission describes the sudden rupture of the field emission site, ejecting solid, liquid, and/or gas materials into the gap. These ejected materials can cause discharge while present in the gap or can settle onto the anode or cathode, modifying the gap from its original structure and compromising its ability to hold off voltage. A second mechanism in which field emission leads to failure is by effects on the anode by the energetic impacts of accelerated electrons. The electrons can cause desorption of gas from the anode, resulting in increased pressure in the gap and lowering the breakdown voltage. It is also possible for energetic electrons to cause ejection of anode materials. When ions released by the anode are accelerated across the gap and impact the cathode, additional electrons or materials are ejected into the gap. This process can precipitate to the point of discharge and/or lowering of the breakdown voltage of the gap. These effects limit vacuum and gas capacitors to relatively low operating voltages and electric fields and thus lower energy density than other technologies using liquid and/or solid dielectrics.

Achieving Electric Field Strengths Greater than 1 GV/m in Vacuum or Gas—It was previously described that electric field levels on the order of GV/m (V/nm) are necessary for vacuum or gas to have energy density comparable to and exceeding that of solid dielectrics. At electric field strengths on the order of GV/m (V/nm), an electrode at negative potential will emit electrons toward the anode. This field emission of electrons can initially only result in a small leakage current. However, field-emitted electrons can cause breakdown of a vacuum or gas dielectric as discussed in the context of the Paschen curve. Energetic collisions of electrons with gas molecules can result in ionization that proceeds to a Townsend-type discharge. Additionally, if field emission continues or reaches a threshold value, explosive emission at the cathode or erosion of anode materials into the vacuum gap can cause breakdown. Thus, for a vacuum or gas dielectric to be reliably operated at field strengths greater than 1 GV/m, consistent with high energy density operation, field emission must be minimized.

In an embodiment of the present invention, field emission is limited by a solid insulating layer coated on one or more electrodes. A solid insulating layer on one or more electrodes reduces the electric field strength at the electrode interface compared to the field present on an electrode with an interface with vacuum or gas. This reduction of the electric field at the electrode surface can reduce or prevent field emission of electrons into the vacuum or gas regions, reducing the accumulation of charge within the dielectric structure and increasing the dielectric strength of the dielectric structure. The cathode of a device with a unipolar bias, such as a DC-link capacitor, for example, can be coated with an insulating layer to prevent electron emission. In a bipolar device, all electrodes can be coated with an insulating layer if the field level at the electrode reaches the GV/m magnitudes where field emission of electrons occurs.

In some embodiments, the insulating layer is a solid dielectric, but may also be a liquid dielectric in some embodiments. In both cases, the dielectric has a dielectric strength above the operating field level at the electrode surface. As the dielectric constant and conductivity of the solid or liquid will be higher than the vacuum or gas, the electric field will be redistributed by the introduction of one or more insulating layers. As described in more detail herein, this redistribution causes the electric field to be lower in the solid or liquid layer and higher in the vacuum or gas. This concentration of the electric field in the vacuum or gas is beneficial for operating the structure at higher voltage in addition to limiting field emission.

The insulating coating could take many forms but is preferentially formed such that it is directly bonded to the electrode(s). In some preferred embodiments, the insulating layer is formed through the oxidation or anodization or other chemical reaction of the electrode. A metal-oxide insulating layer can readily be formed when the electrode is composed of aluminum, titanium, hafnium, niobium, tantalum, silicon, or combinations thereof. These and other electrode materials, such as carbon, nickel, silver, gold, or combinations thereof can also be adjoined by an insulating layer through chemical or physical deposition. Other potential insulating layers include but are not limited to diamond, boron nitride, aluminum nitride, silicon nitride, or combinations thereof. As the concentration of the electric field in the vacuum or gas increases with increased dielectric constant of the insulating layer, higher dielectric constants are preferred in cases in which the dielectric strength and conductivity of the insulating layers are equivalent. As there are diminishing returns by further increasing the dielectric constant of the insulating layer, dielectric constants of 9 or 10 are selected in preferred embodiments using aluminum oxide, diamond, aluminum nitride, or combinations thereof, as the insulating layer. Accordingly, the solid or insulating layer may be selected from least one of alumina, diamond, tantalum oxide, hafnia, niobia, titania, silica, silicon nitride, aluminum nitride, boron nitride, or combinations thereof.

In an embodiment, the thickness of the insulating coating is minimized as the energy density within the insulating layer is lower than that in the vacuum or gas. However, the thickness is large enough to prevent tunneling or other phenomena that may result in emission of electrons into the vacuum or gas. The thickness of the insulating coating is preferred to be less than 10% of the total thickness of the dielectric structure.

The insulating coating(s) on the electrodes are intended to limit field emission. However, it is likely that there will still be some free electrons in the vacuum or gas which will be accelerated by the electric field. These electrons could be present from field emission not being completely eliminated by the insulating coating(s), ionization within the gap from cosmic radiation or similar bombardment by high energy particles, partial discharge of space charge accumulated on an insulating layers' surfaces, and other mechanisms. To address the potential of breakdown due to electron avalanche or secondary emission from these free electrons, the gap spacing of the vacuum or gas-equivalent region is small in the direction parallel with the electric field, in an embodiment.

In any non-ideal vacuum, neutral gas particles will be present in the volume not occupied by the electrodes or solid insulation. These free electrons can gain energy sufficient to cause ionization, heating, and other effects that degrade the insulating properties of the structure through collisions with gas molecules, the anode, or a solid insulating layer. Considering collisions with gas molecules, a free electron accelerated by the high electric field present in the vacuum or gas volume can excite or ionize a gas molecule upon collision. Gain in the number of free electrons due to these collisions can lead to failure of the structure as an electrical insulator. Alternatively, an energetic collision of one or more electrons with the anode can cause ejection of electrons, ions, or anode materials and the desorption of materials from the anode. The introduction of these electrons, ions, or other materials from the anode can change the structure or electric field distribution in the structure, leading to degradation or failure of the structure as an insulator. If there is another solid insulator between the vacuum or gas region and anode, an energetic electron has a probability of a collision with the solid insulator. Accumulation of space charge on the insulators can alter the electric field in the insulator and potentially cause aging. If the electron has sufficient energy, more than one secondary electron may be emitted from the impact of the initial electron on the insulator. Gain in the number of free electrons should be avoided to prevent additional accumulation of space charge and modification to the electric field distribution in the structure. Energetic collisions can also cause heating of the solid insulating layer, accumulation of space charge, and other damaging effects. Therefore, the structure is designed to limit the energy gained by a free electron before its collision with a gas molecule, the anode, or a solid insulating layer.

To minimize energetic collisions of electrons with gas molecules, the anode, and solid insulating layers, the vacuum or gas gap distance along an axis parallel to the applied electric field is limited by the following factors in some embodiments. To minimize ionization of gas molecules by energetic electrons, the gap distance is on the same order of magnitude as the mean free path or smaller, in an embodiment. The electron mean free path in gas is dependent on several factors, including the gas species, gas pressure, energy of the electron, and the resulting cross-section for collisions. At atmospheric pressure, the mean free path is on the order of microns. As the gas pressure is reduced, the mean free path can be increased to many meters. However, since the dimensions of any single vacuum or gas gap in the preferred embodiments of this invention is less than 1 micron along the axis parallel with the applied electric field, it is often unnecessary to reduce the pressure below atmospheric pressure to prevent ionizing collisions between electrons and gas molecules. Due to the low probability of a collision between a free electron and a gas molecule, gas at atmospheric pressure and lower pressures is effectively vacuum from the perspective of a free electron at these small size scales. Due to this equivalence between vacuum and gas from the perspective of free electrons, vacuum, partial vacuum, or gas are used collectively and interchangeably to refer to the non-solid component of the insulating structure. The gas pressure in some embodiments of the invention may be reduced to enable high temperature operation of a sealed device, in which the gas pressure will increase as the temperature is increased. Limiting the peak gas pressure at high temperature by making the structure with partial vacuum not only ensures the mean free path will remain larger than the maximum gap spacing of the partial vacuum region(s) but also prevents the containment of the capacitor from being over pressurized at high temperature.

Free electrons accelerated by the applied electric field will impact either a solid insulating layer or the anode. These electrons can cause secondary electrons to be emitted by either the insulator or metal. The ratio of emitted secondary electrons to primary incident electrons is the secondary electron emission gain. To minimize the accumulation of space charge within the structure, the gain from secondary emission is typically kept below 1. The secondary electron emission gain is a material-dependent property that varies with the energy of the incident primary electron. At low energies, the gain is below 1. As the energy of the incident electron(s) increase(s), the secondary electron emission gain increases. At a threshold energy value, $E_1$, the gain is 1, and further increases in the incident electron energy will produce more than one secondary electron. An insulator impacted by electrons with energy below $E_1$ will tend to charge negatively due to an accumulation of electrons. An insulator impacted by electrons with energy above $E_1$ and below a second threshold value, $E_2$, will emit more electrons than the number impacting it and tend to charge positively. For many insulators of the preferred embodiments of this invention, the $E_1$ value is on the order of tens of electron volts (e.g., approximately 74±8 eV for aluminum oxide). At these relatively low electron energy levels between 10 and 200 eV, the penetration depth of an electron in solid insulators of interest to these structures is on the order of nanometers. This short penetration depth makes transmission of electrons through any single solid insulating layer at electron energies below approximately 1 keV unlikely. Since accumulation of space charge can alter the electric field distribution in the insulating structure and lead to premature breakdown, generation of excess free charges must be avoided. To enable the structure to be operated at high electric fields while limiting the accumulation of space charge, the maximum ideal field level and gap spacing can be chosen to accelerate any free electrons up to the $E_1$ level for the selected solid insulator. For example, if the $E_1$ value is 70 eV, the structure may be designed to operate at a field of 2 GV/m and a gap spacing of 35 nm. Smaller gap spacing would allow higher fields provided the field distribution in the structure does not cause the field in the solid insulation to exceed its breakdown strength. As a second example, the same 70 eV value for unity gain of secondary electron emission could be obtained with a structure operating at 4 GV/m in the vacuum or gas with a gap spacing of 17.5 nm. It should be noted that these combinations of field levels in the vacuum or gas and gap spacings are not required to realize the benefits of the dielectric structure of embodiments of this invention. For a given gap spacing, the insulator can be operated at electric fields both lower and higher than those calculated for minimized generation of excess free electrons.

In many cases, the desired operating voltage of the dielectric structure will be greater than the voltage corresponding to the $E_1$ threshold. Higher operating voltage is achieved by adding additional layers of solid insulation and vacuum/gas gaps. The dielectric structure thus can be extended to many layers of a vacuum/gas gap separated by layers of solid insulation. The solid insulation both limits the gap distance along the axis parallel to the electric field and provides mechanical structure. The distance between each layer of solid insulation can be determined from the same design principles as previously described for the general case of a single vacuum or gas gap.

As previously described, solid insulators cannot typically be operated at electric field levels on the order of GV/m as needed for high energy density storage in vacuum or gas. Therefore, to store more energy in the vacuum or gas gaps than would otherwise be stored in a completely solid structure, the electric field must be distributed between the solid and vacuum or gas layers such that the operating field strength in the vacuum or gas is much higher than that in the solid layers. This distribution of the electric field can be accomplished by exploiting the differences in the dielectric constant and resistivity between solid insulators and thin vacuum or gas regions. A series of simulations of composite structures has been included to both describe how the electric field is distributed between these different materials and to demonstrate how these structures enable high energy density electrical storage in vacuum or gas regions.

Figure 3:
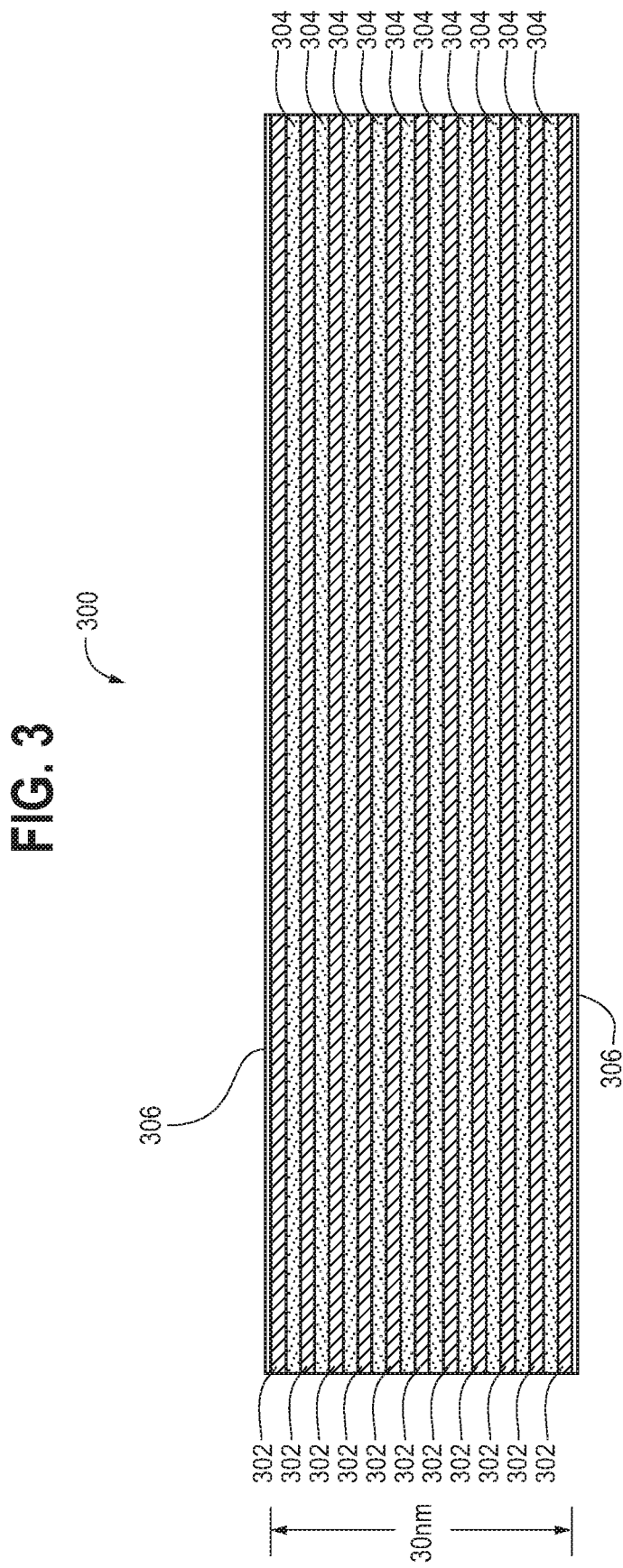
FIG. 3 is a cross-section of a capacitive structure comprised of a dielectric of alternating layers of a solid and vacuum or gas between two electrodes in accordance with one embodiment of the present invention.

As a first example of a structure of solid and vacuum or gas regions capable of operation at fields greater than 1 GV/m, the layered structure of FIG. 3 is presented. FIG. 3 is a cross-section of a capacitive structure 300 comprised of a dielectric of alternating layers of solid material regions 302 and vacuum or gas regions 304 between two electrodes 306 in accordance with an embodiment. The figure shows a cross-section of the structure to reveal twenty-one layers of insulators (i.e., twenty-one layers of solid material regions 302 and vacuum or gas regions 304). In an embodiment, the solid material of the solid material regions 302 is a dielectric with a dielectric constant of ten and effectively infinite resistance (e.g., a resistance on the order of megaohms or higher such that the solid material regions 302 can effectively be modeled as infinite resistance, etc.). In an embodiment, the vacuum or gas of the vacuum or gas regions 304 has a dielectric constant of one and effectively infinite resistance (e.g., a resistance on the order of megaohms or higher such that the vacuum or gas regions 304 can effectively be modeled as infinite resistance, etc.). On the top and bottom layers, thin electrode layers (i.e., electrodes 306) of 0.01 nm thickness are applied as effectively perfect conductors (e.g., conductors having a conductivity on the order of $10^7$ S/m or higher such that they can effectively be modeled as perfect conductors in an electrostatic simulation, etc.), in an embodiment. Thus, the embodiment of capacitive structure 300 illustrated in FIG. 3 is formed with a total of eleven solid insulating layers (e.g., solid material regions 302). Solid insulation (e.g., solid material regions 302) covers both electrodes 306. There are ten total vacuum or gas regions 304 with all vacuum or gas regions (i.e., layers) contained by solid material regions 302 on the top and bottom. The thickness of all insulator layers (e.g., solid material regions 302 and vacuum or gas regions 304) is equal and set to (30/21) nm as the total thickness of all twenty-one regions/layers is 30 nm in the illustrated embodiment. In an embodiment, the solid material regions 302 are comprised of at least one of a metal oxide, diamond, or nitride. In another embodiment, the solid material regions 302 are comprised of at least one of alumina, diamond, tantalum oxide, hafnia, niobia, titania, silica, silicon nitride, boron nitride, or aluminum nitride. In an embodiment, the gas regions 304 are comprised of one or more of air, nitrogen, sulfur hexafluoride, oxygen, hydrogen, carbon dioxide, perfluorocarbons, or chlorofluorocarbons. In an embodiment, the electrodes 306 are comprised of an electrode conductor, and wherein the electrode conductor is a metal, a semiconductor material, a liquid electrolyte, or a solid electrolyte. In another embodiment, the electrodes 306 are comprised of an electrode conductor, and wherein the electrode conductor is at least one of aluminum, carbon, hafnium, niobium, silicon, titanium, nickel, silver, gold, or tantalum.

The insulating layers (e.g., solid material regions 302 and vacuum or gas regions 304) and electrodes 306 are constructed in this example embodiment with square dimensions of 10,000 nm per side. These dimensions allow the length and width of the capacitive structure 300, and therefore area, to be very large (e.g., over three hundred times greater than, etc.) with respect to the thickness of the capacitive structure 300. The small thickness of the layers/regions relative to the area of the capacitive structure does not impact the distribution of the fields between the different layers (e.g., solid regions 302 and vacuum or gas regions 304) but does allow the capacitive structure 300 to be defined within the bounds of computational limits.

Figure 4:
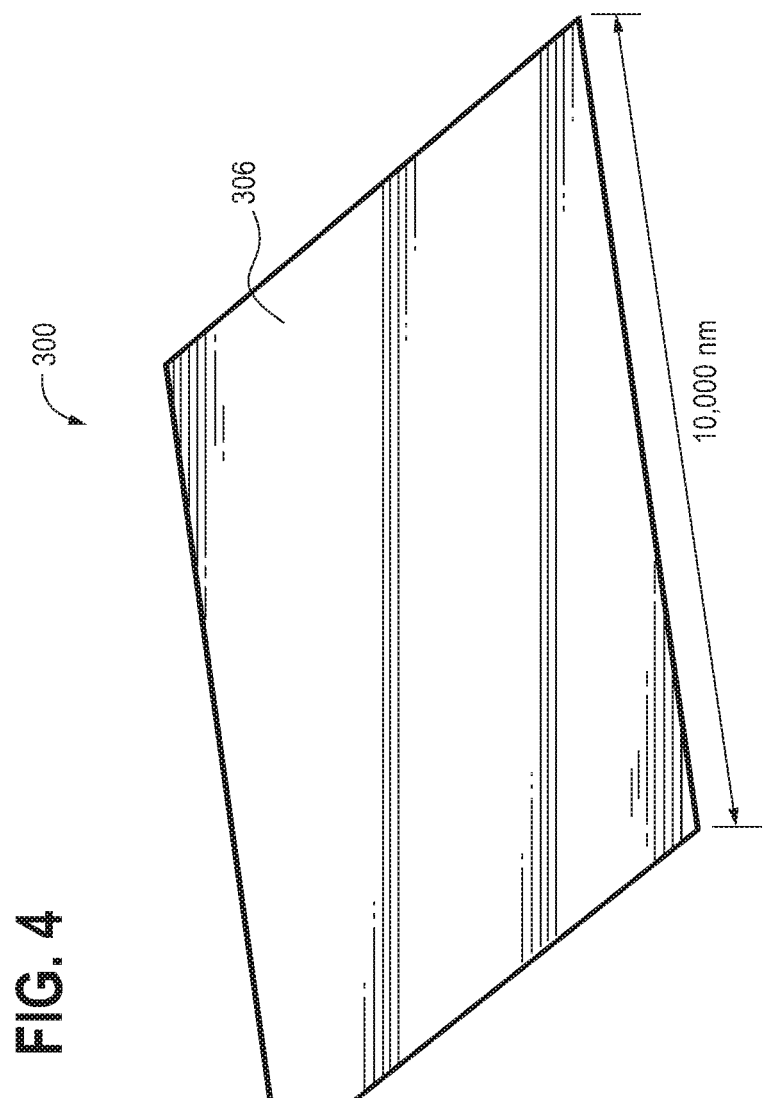
FIG. 4 is a perspective view of the capacitive structure of FIG. 3 showing the large length and width dimensions in comparison to the dielectric thickness in accordance with one embodiment of the present invention.

The large area of the capacitive structure 300 allows the capacitance and energy of the structure to be calculated and analyzed with a small percentage of error introduced by fringe capacitance outside the dielectric structure. FIG. 4 provides a perspective view of the entire capacitive structure 300 and electrodes 306 to show the large area of the capacitive structure 300 in contrast to the thickness.

An electrostatic simulation of the layered capacitive structure 300 was performed by applying a potential difference of 63.42 V. One electrode 306 was defined to be at a fixed potential of +31.71 V, and the other electrode 306 was defined to have a fixed potential of −31.71 V. The resulting absolute values of the electric field projected onto the two-dimensional cross-section of the capacitive structure 300 illustrated in FIG. 3 alternates between a value of approximately 400 MV/m in the solid insulation regions 302 and 4 GV/m in the vacuum or gas insulation regions 304. The ratio of the electric field in the vacuum or gas regions 304 to the electric field in the solid regions 302 is approximately equal to the ratio of the dielectric constant of the solid material to the dielectric constant of vacuum or gas. This ratio equivalence demonstrates how the layered capacitive structure 300 compresses the electric field into the low dielectric constant regions/layers.

Figure 5:
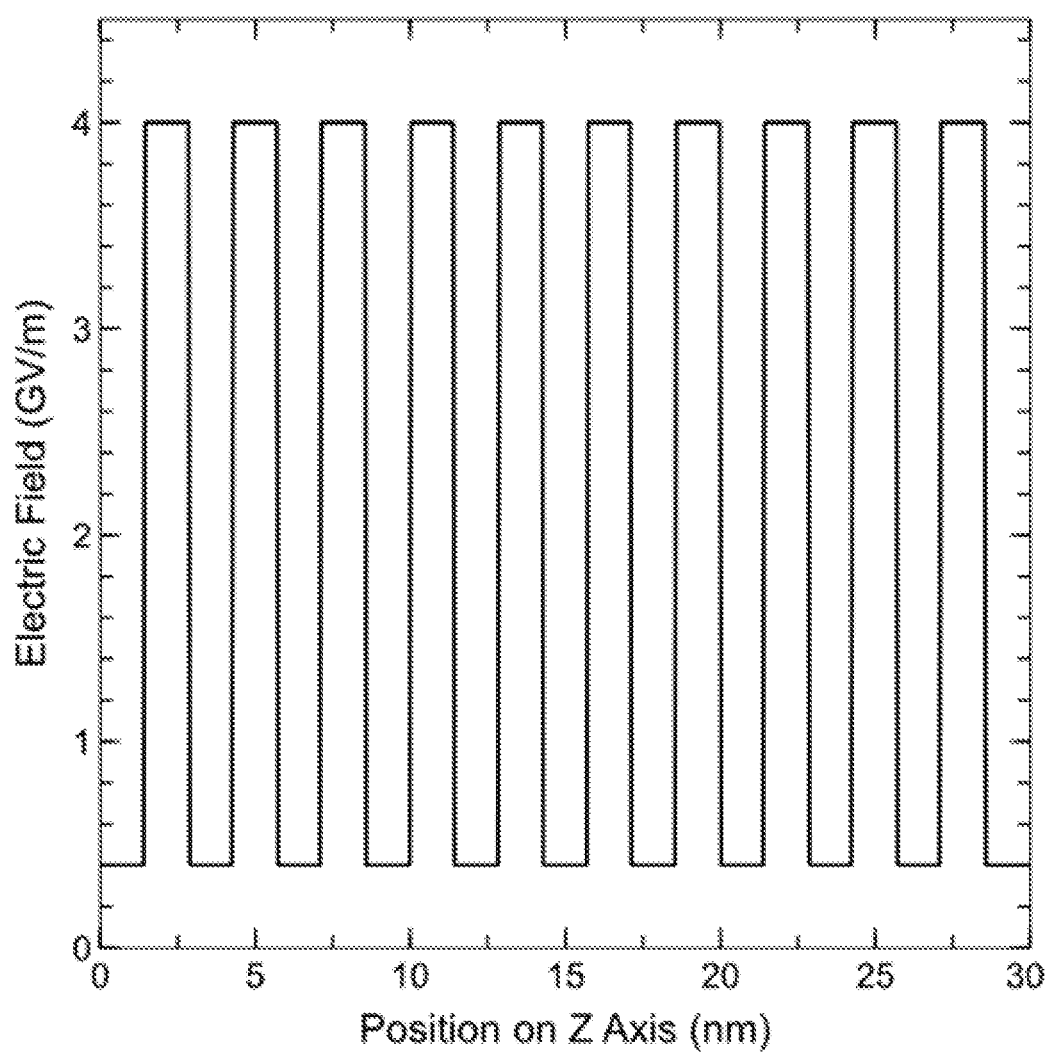
FIG. 5 is a plot of the absolute value of an electric field applied along a line perpendicular to the electrodes of the capacitive structure of FIG. 3, in accordance with one embodiment of the present invention.

FIG. 5 is a plot of the absolute value of an electric field applied along a single line traversing (e.g., perpendicular to) the twenty-one dielectric regions/layers of the capacitive structure 300 of FIG. 3, showing the difference in the electric field magnitude in the solid regions 302 and vacuum or gas regions 304 in accordance with an embodiment. The transitions between the layers are clearly seen as the electric field is either 400 MV/m (in the solid regions 302, $\varepsilon_r=10$) and 4 GV/m (in the vacuum or gas regions 304, $\varepsilon_r=1$). It is noted that the field level of 400 MV/m and dielectric constant of 10 for the solid insulation regions 302 is consistent with operating levels in high energy density capacitors using an aluminum oxide dielectric. Thus, the electric field remains within practical limits of the solid dielectric regions 302 while being enhanced to levels on the order of GV/m in the vacuum or gas regions 304. The electric field in the solid dielectric regions 302 is lower in the capacitive structure 300 than an all-solid structure, which would have an electric field of greater than 2.1 GV/m (63.42 V distributed evenly across 30 nm) throughout the all-solid dielectric. Thus, in an embodiment, the capacitive structure 300 enables a thinner total dielectric thickness than a capacitive structure having an all-solid dielectric that could be realized within the known electric field limitations of the solid dielectric.

The electrical energy density can also be projected onto the two-dimensional cross-section of the capacitive structure 300 illustrated in FIG. 3. Following the distinct transitions in the electric field in different regions/layers, the electrical energy density is significantly different depending on the material properties. The energy density is 7.08 J/cm$^3$ in the solid insulation regions 302 and 70.8 J/cm$^3$ in the vacuum or gas insulation regions 304.

Figure 6:
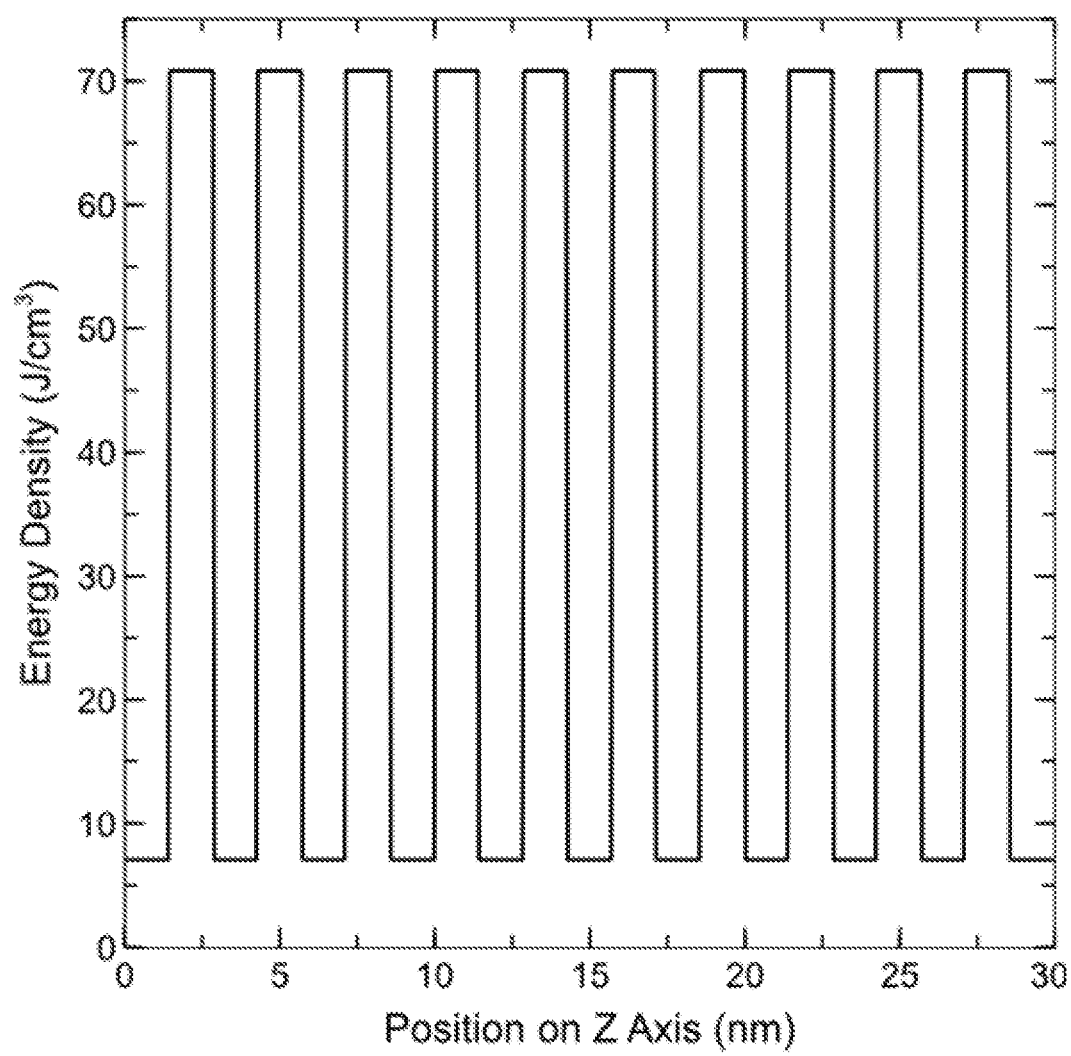
FIG. 6 is a plot of the absolute value of the electrical energy density along a line perpendicular to the electrodes of the capacitive structure of FIG. 3, in accordance with one embodiment of the present invention.

FIG. 6 is a plot of the absolute value of the electrical energy density along a line traversing (e.g., perpendicular to) the twenty-one dielectric regions/layers of the capacitive structure 300 of FIG. 3, showing the difference in the electrical energy density in the solid regions 302 and vacuum or gas regions 304 in accordance with an embodiment. The higher electric field in the vacuum or gas regions 304 by a factor of ten results in the electrical energy density in the vacuum or gas regions 304 being higher by a factor of ten despite the higher dielectric constant of the solid insulation regions 302.

The capacitance calculated for this capacitive structure 300 is approximately $5.6\times10^{-14}$ F. Given the dimensions of the capacitive structure 300, the dielectric constant of the capacitive structure 300 is approximately 1.9. The final analysis of this example capacitive structure 300 was a calculation of the total energy stored per material. There are three dielectric materials in this case when including the background surrounding the capacitive structure 300. The background was defined to have a dielectric constant of 1. The total energy stored in the eleven solid insulation regions 302, ten vacuum or gas insulation regions 304, and surrounding background were calculated to be approximately $1.13 \times 10^{-11}$ J, $1.01 \times 10^{-10}$ J, and $1.57 \times 10^{-12}$ J, respectively. Thus, approximately 8.9 times the total energy in the solid insulation regions 302 is stored in the vacuum or gas insulator regions 304. This factor is not ten due to the additional solid insulation region 302 in this example embodiment and the relatively small number of overall regions/layers. When the number of regions/layers increases and the extra volume of solid insulation regions 302 due to the extra solid insulation region 302 become more negligible, this factor approaches ten. The preceding example demonstrates the possibilities to store very large amounts of energy in layers of vacuum or gas in comparison to solid insulators.

The degree of field compression as measured by the ratio of the electric field in the vacuum or gas regions 304 to the electric field in the solid insulation regions 302 is dependent on the dielectric constant of the solid insulation. If the dielectric constant of the solid insulation were theoretically one, the electric field in all layers would be equal.

Figure 7:
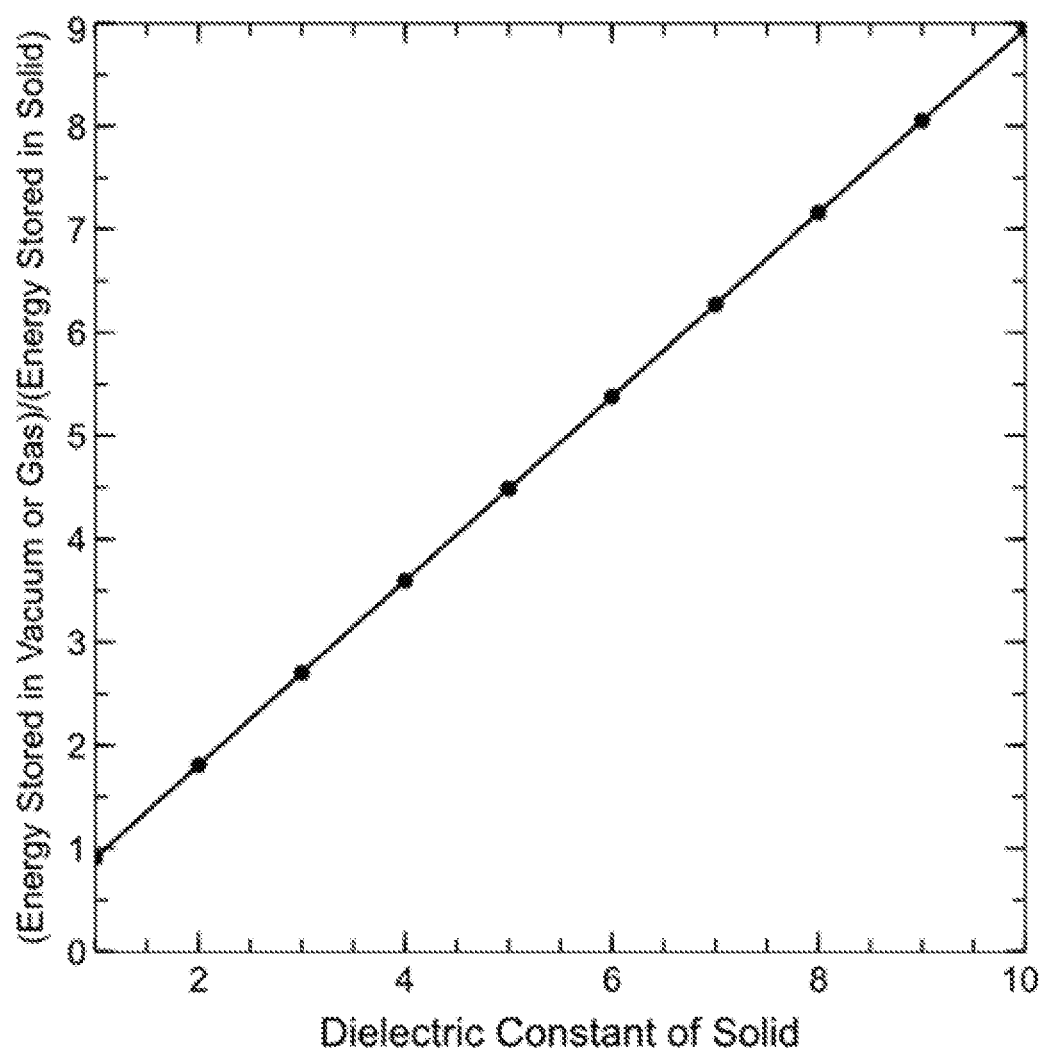
FIG. 7 is a plot of the ratio of the total energy stored in the vacuum or gas to the total energy stored in the solid insulation of the capacitive structure of FIG. 3, in accordance with one embodiment of the present invention.

FIG. 7 is a plot of the ratio of total energy stored in the vacuum or gas regions 304 to the total energy stored in the solid regions 302 of the capacitive structure 300 of FIG. 3 with respect to the dielectric constant of the solid insulation increasing from 1 to 10 in accordance with an embodiment. Higher dielectric constants of the solid insulation result in a larger percentage of the total energy being stored in the vacuum or gas regions 304, but there are diminishing returns on further increases in the dielectric constant of the solid insulation. As the maximum total energy stored in the solid dielectric is limited by the dielectric strength of the solid, the choice of solid insulation in the composite structure that maximizes the total energy stored often has a lower dielectric constant than other candidate materials.

Practical Structures—The previous example demonstrates that a properly designed composite of solid regions 302 and vacuum or gas regions 304 can operate at a higher electric field and store much more energy in a given volume than an all-solid structure given the same limitations of the operating field of the solid. However, in some embodiments, it is not practical to have fully-isolated regions/layers of vacuum or gas. There may be some mechanical structure to support the solid regions 302 and maintain the dimensions of the vacuum or gas regions 304. There are multiple types of composite structures that may provide vacuum or gas regions 304 (e.g., pores, gaps, spaces, holes, cavities, voids, etc.) within (e.g., dispersed/distributed throughout) a solid matrix (e.g., a matrix of solid regions 302). In some embodiments, the composite structure comprised of a three-dimensional (3D) network of solids and pores provide an adequate approximation to the ideal layered example. In particular, the aspect ratio and alignment of the pores can be considered as a critical factor.

Figure 8:
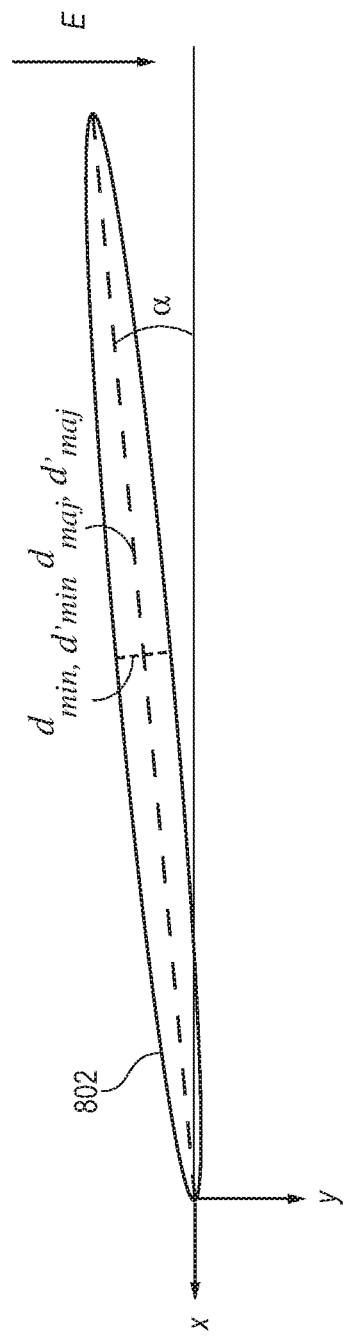
FIG. 8 is a diagram of a cross-section of an oblate spheroid comprising a single pore or particle of a dielectric structure and its relation to an applied electric field, in accordance with one embodiment of the present invention.

FIG. 8 is a diagram of the cross-section of an oblate spheroid 802 that can represent either a pore (e.g., a region of vacuum or gas 304) or a solid particle (e.g., a solid material region 302) in the capacitive structure 300 of FIG. 3 and that oblate spheroid's alignment with respect to an applied electric field, E. The plane of the cross-section is defined by the x and y axes shown in FIG. 8, and the z axis would thus extend out of the page. The electric field is defined to be parallel with the y axis. The pore or solid particle represented by the oblate spheroid 802 in FIG. 8 is anisotropic such that the average particle dimension in one plane, $d_{maj}$ or $d'_{maj}$, is larger than the average particle dimension in a perpendicular plane, $d_{min}$ or $d'_{min}$. The aspect ratio of the pore or particle is defined as $d_{maj}/d_{min}$ or $d'_{maj}/d'_{min}$. As the aspect ratio is increased, the shape of the oblate spheroid 802 becomes more flat and can be described by flake, platelet, or ribbon shapes that more closely approximate the ideal layered embodiment (e.g., illustrated in FIG. 3). As with the layered embodiment illustrated in FIG. 3, the orientation of the anisotropic shape (e.g., oblate spheroid 802) is such that the major dimension, $d_{maj}$ or $d'_{maj}$, is perpendicular to the applied electric field. However, perfect alignment is neither practical nor required, and an angle, $\alpha$, is defined as the angle between the plane of the major dimension in the cross-section to the x axis, which is perpendicular to the applied electric field. When the angle $\alpha$ is less than 45° ($\pi/4$ radians) the pore or particle is considered aligned and will be generally referred to as aligned generally perpendicular to the applied electric field. Thus, as used in embodiments herein, the term generally perpendicular means the major dimension of a pore or particle being within 45° (i.e., 45° or less) of perpendicular to an applied electric field.

If the vacuum or gas regions have an aspect ratio of one and are isotropic, the electric field will not be adequately compressed into the vacuum or gas regions, and there will be an insufficient ratio of the electric field in the vacuum or gas regions to the electric field in the solid to justify including vacuum or gas regions in the dielectric. Therefore, the vacuum or gas regions of the embodiments of the present invention are more plate-like and similar to the high aspect ratio layers of the previous example. In an embodiment, the aspect ratio is a minimum of four and has no maximum as the aspect ratio goes to infinity in the case of a layered structure.

Figure 9:
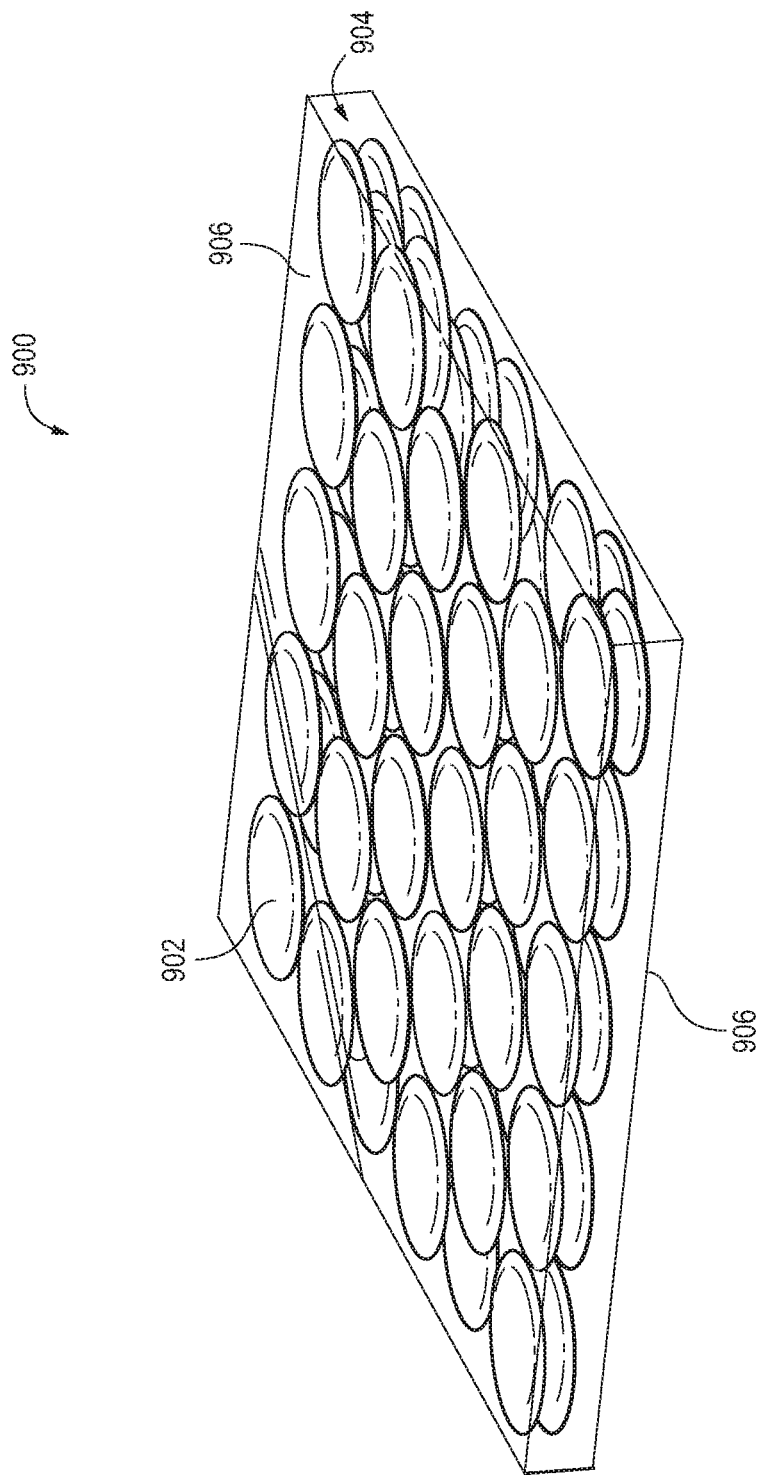
FIG. 9 is a perspective view of vacuum or gas pores of oblate spheroids in a face-centered cubic arrangement within a solid matrix, in accordance with one embodiment of the present invention.

FIG. 9 shows a perspective view of an example embodiment of a composite structure 900 including vacuum or gas pores 902 of oblate spheroids (e.g., oblate spheroid 802, etc.) in a face-centered cubic arrangement within (e.g., dispersed/distributed throughout) a solid matrix 904, in accordance with an embodiment. The vacuum or gas pores 902 and the solid matrix 904 are disposed between electrodes 906. In the illustrated embodiment, the electrodes 906 and solid insulation matrix 904 are semi-transparent to illustrate the pores 902.

The example embodiment of the composite structure 900 is comprised of the solid matrix 904 with a dielectric constant of ten with the inclusion of many pores 902 of vacuum or gas (e.g., dispersed/distributed throughout the solid matrix). The pores 902 are defined as oblate spheroids (e.g., oblate spheroid 802, etc.) with a dielectric constant of one and a major dimension ($d'_{maj}$) of 40 nm. The minor dimension ($d'_{min}$) is 2 nm for an aspect ratio of twenty. The pores 902 are arranged in a face-centered cubic structure with a spacing between pores of 1 nm along the axes parallel with the major dimension and a spacing of 0.1 nm along the axis parallel with the minor dimension. The choice of oblate spheroids and a face-centered cubic packing are only one example of many pore shapes and packing types that can be used in embodiments of the invention. In some embodiments, the pores 902 are interconnected, and the use of isolated pores 902 is for example purposes only and not intended to limit embodiments with interconnected pores 902. The dimensions of the capacitor structure 900 are 204.5 nm by 206 nm in the axes parallel to the major pore dimension and 14.5 nm in the axis parallel to the minor dimension. The dimensions, number of pores, and number of pore layers of the example embodiment of the composite structure 900 are not intended to be limiting. In the example embodiment of composite structure 900, the electrodes 906 have a conductivity on the order of $10^7$ S/m or higher such that they can be modeled as perfectly conducting electrodes in an electrostatic simulation with a thickness of 0.01 nm in the two surfaces parallel with the major dimension. Layers of solid insulation are present along the interfaces with the electrodes 906 for a thickness of 1 nm before the pores 902 are present. In an embodiment, the solid matrix 904 is comprised of at least one of a metal oxide, diamond, or nitride. In another embodiment, the solid matrix 904 is comprised of at least one of alumina, diamond, tantalum oxide, hafnia, niobia, titania, silica, silicon nitride, boron nitride, or aluminum nitride. In an embodiment, the gas pores 902 are comprised of one or more of air, nitrogen, sulfur hexafluoride, oxygen, hydrogen, carbon dioxide, perfluorocarbons, or chlorofluorocarbons. In an embodiment, the electrodes 906 are comprised of an electrode conductor, and wherein the electrode conductor is a metal, a semiconductor material, a liquid electrolyte, or a solid electrolyte. In another embodiment, the electrodes 906 are comprised of an electrode conductor, and wherein the electrode conductor is at least one of aluminum, carbon, hafnium, niobium, silicon, titanium, nickel, silver, gold, or tantalum.

Figure 10:
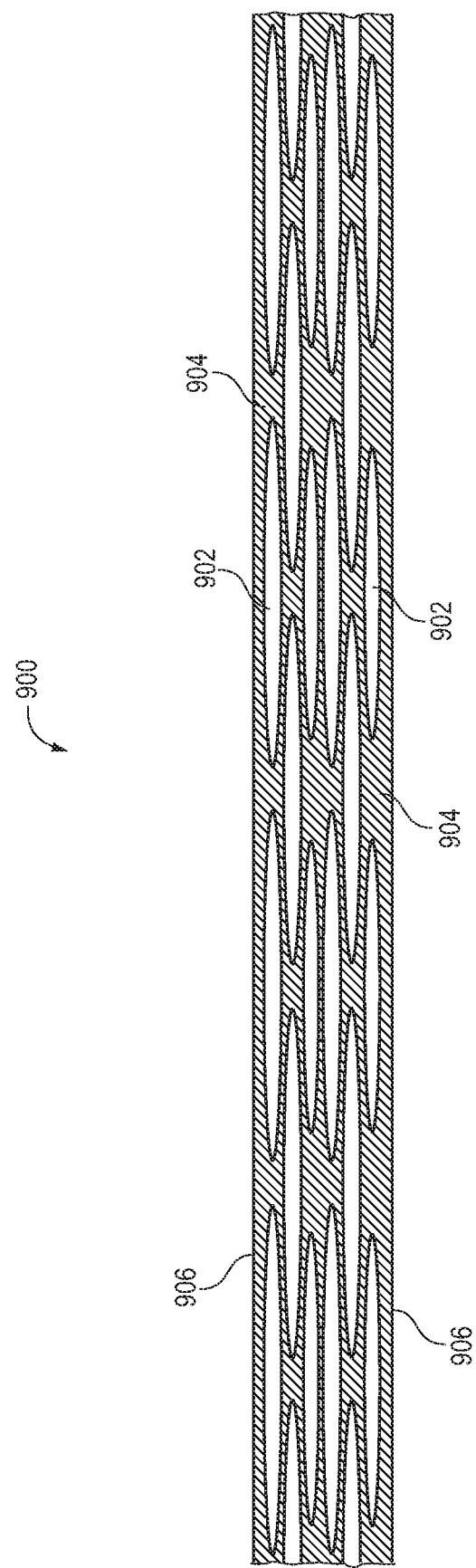
FIG. 10 is a cross-sectional view of the oblate spheroids within the solid matrix of FIG. 9 in accordance with one embodiment of the present invention.

FIG. 10 shows a cross-sectional view of the composite structure 900 of FIG. 9 showing the pores 902 dispersed/distributed within a three-dimensional network of the solid insulation matrix 904. The composite structure 900 was simulated with an applied potential difference of 12.25 V (e.g., +7.625 V applied to a first electrode 906 and −7.625 V applied to a second electrode 906).

Figure 11:
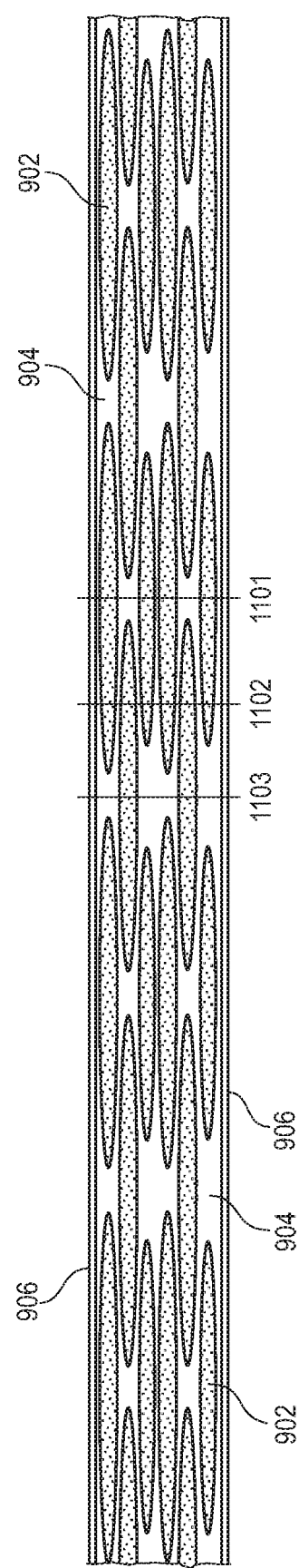
FIG. 11 is a plot of the absolute value of an electric field on the two-dimensional cross-section of FIG. 10 of the composite structure of oblate spheroids of vacuum or gas pores in the solid matrix, in accordance with one embodiment of the present invention.

FIG. 11 is a plot of the absolute value of an electric field on the two-dimensional cross-section of FIG. 10 of the composite structure 900 of oblate spheroids of vacuum or gas pores 902 in the solid matrix 904 with $\varepsilon_r=10$ (Y=119.466), in accordance with an embodiment. The face-centered cubic packing of the oblate spheroid pores 902 does not extend to the edges of the capacitor structure 900 in this example embodiment, so the fields at the edges of the capacitor structure 900 can be ignored. The field results of importance are away from the edges of the structure 900 where the oblate spheroid pores 902 are fully packed in a face-centered cubic arrangement. In FIG. 11, the shaded areas represent electric fields above 1 GV/m.

It is clear from analysis of FIG. 11 that the large aspect ratio of the pores 902 of the composite structure 900 causes the compression of the electric field into the porous volume. Unlike the simple case of a layered structure as previously considered (e.g., FIG. 3), there is variation of the field magnitude both within the pores 902 and the solid matrix 904. To quantify the variation of the electric field in both the pore regions 902 and the solid matrix regions 904, the following three graphs were produced by plotting the electric field along the three labeled 1101, 1102, 1103 lines parallel to the applied field in FIG. 11.

Figure 12:
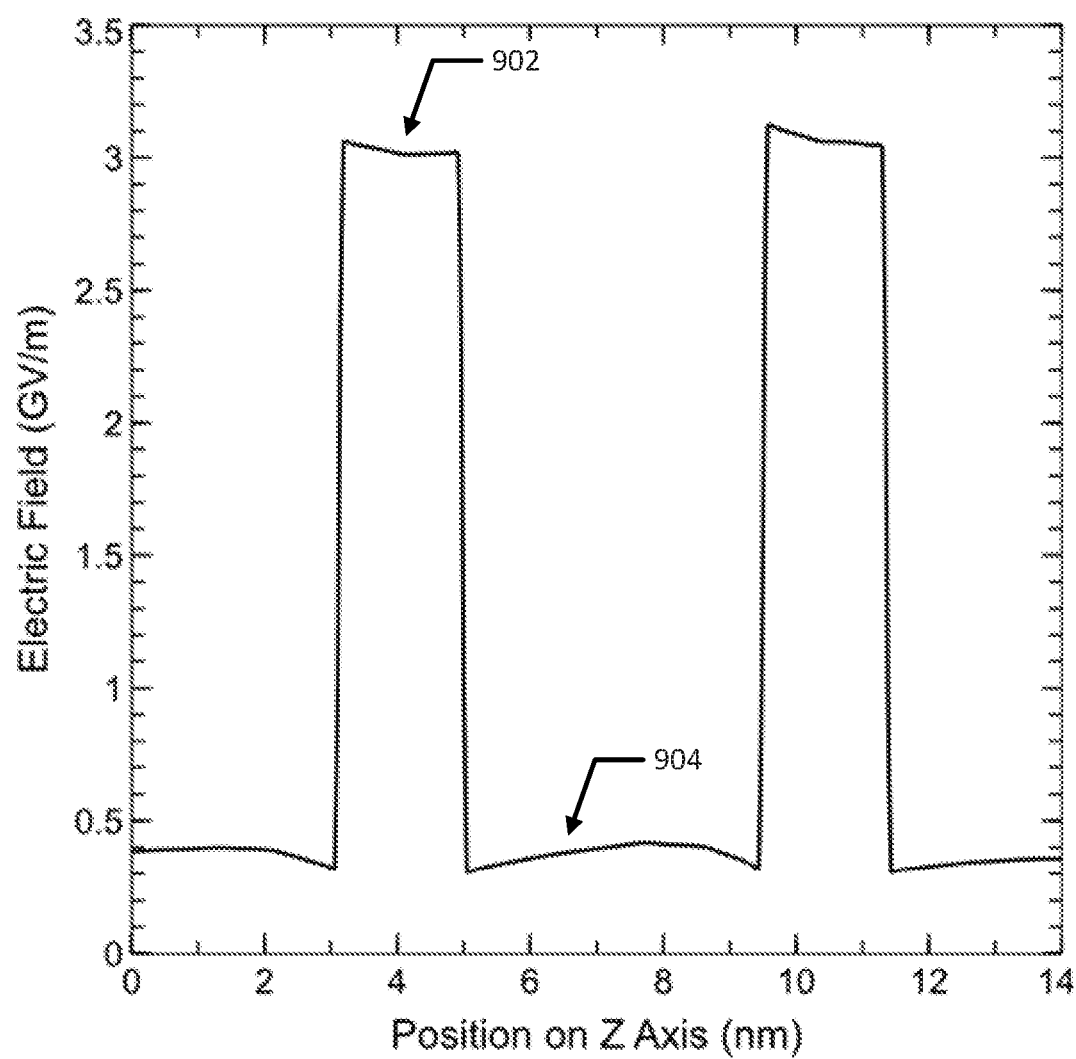
FIGS. 12-14 are plots of the electric field along the axis perpendicular to the electrodes from the plot of FIG. 11, in accordance with embodiments of the present invention.

FIG. 12 is a plot of the electric field along the axis perpendicular to the electrodes 906 illustrated at line 1103 (Y=119.466; X=102; Z=0 to 14.5) in FIG. 11. The regions of higher electric field correspond to the pores 902 with $\varepsilon_r=1$, and the regions of lower electric field correspond to the solid matrix 904 with $\varepsilon_r=10$. The electric field in the pores 902 ranges from approximately 3.0 GV/m to 3.12 GV/m, and the electric field in the solid matrix 904 varies from less than 0.3 GV/m to 0.42 GV/m. These ranges correspond to ratios of the electric field in the pores 902 to electric field in the matrix 904 from 7.14 to 10.4.

Figure 13:
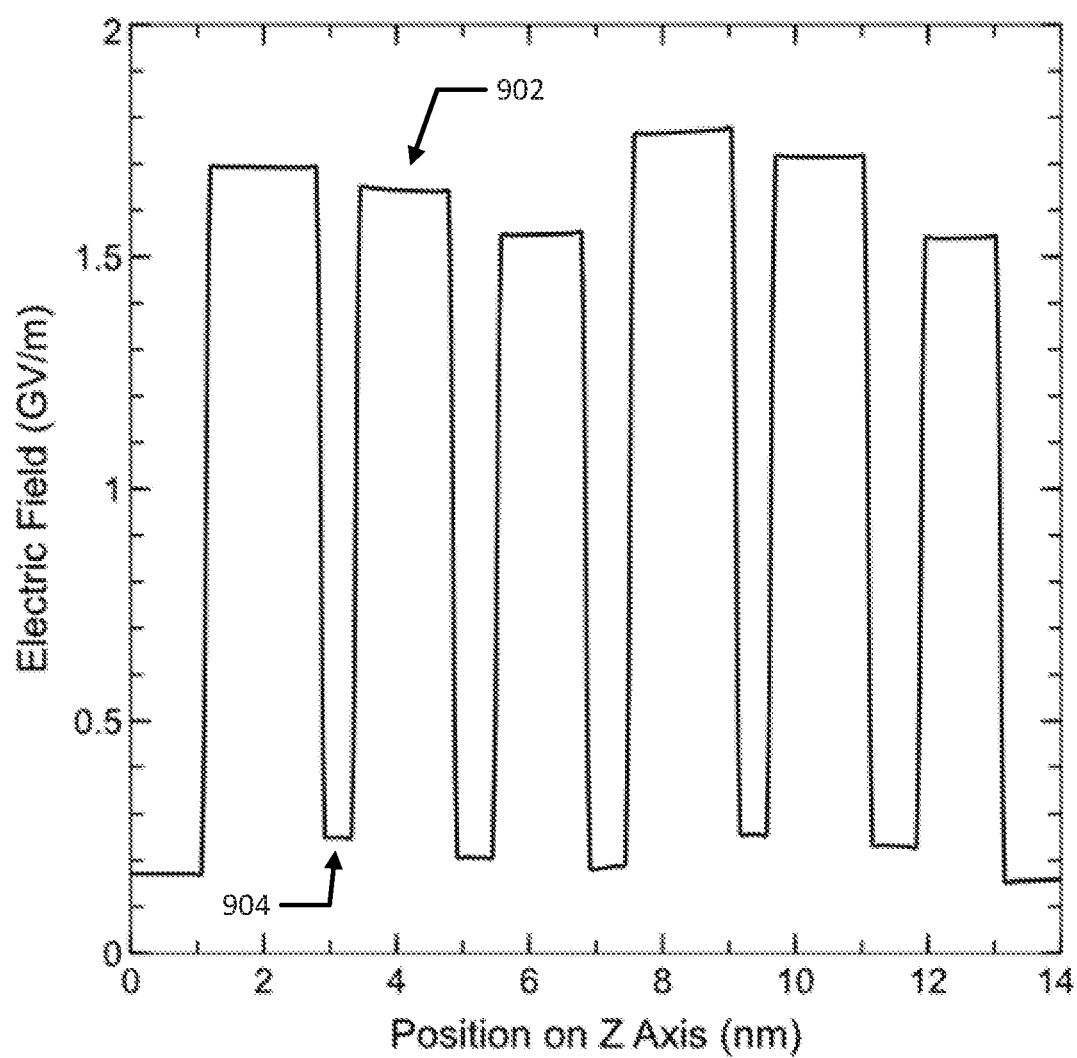

FIG. 13 is a plot of the electric field along the axis perpendicular to the electrodes 906 illustrated at line 1102 (Y=119.466; X=114; Z=0 to 14.5) in FIG. 11. Again, the higher electric field is present in the volume of the pores 902, and the lower electric field is present in the solid matrix 904. The electric field within the pores 902 is between approximately 1.54 GV/m and 1.78 GV/m in the regions of the pores 902. The electric field in the solid matrix 904 is between approximately 0.154 GV/m and 0.256 GV/m in the regions of the solid matrix 904. These values correspond to a ratio of the electric field in the pores 902 to the electric field in the solid matrix 904 of between 6 and 11.6. The electric field in this region (e.g., at line 1102) of the structure 900 most closely resembles the electric field in the layered example (e.g., of FIG. 3).

Figure 14:
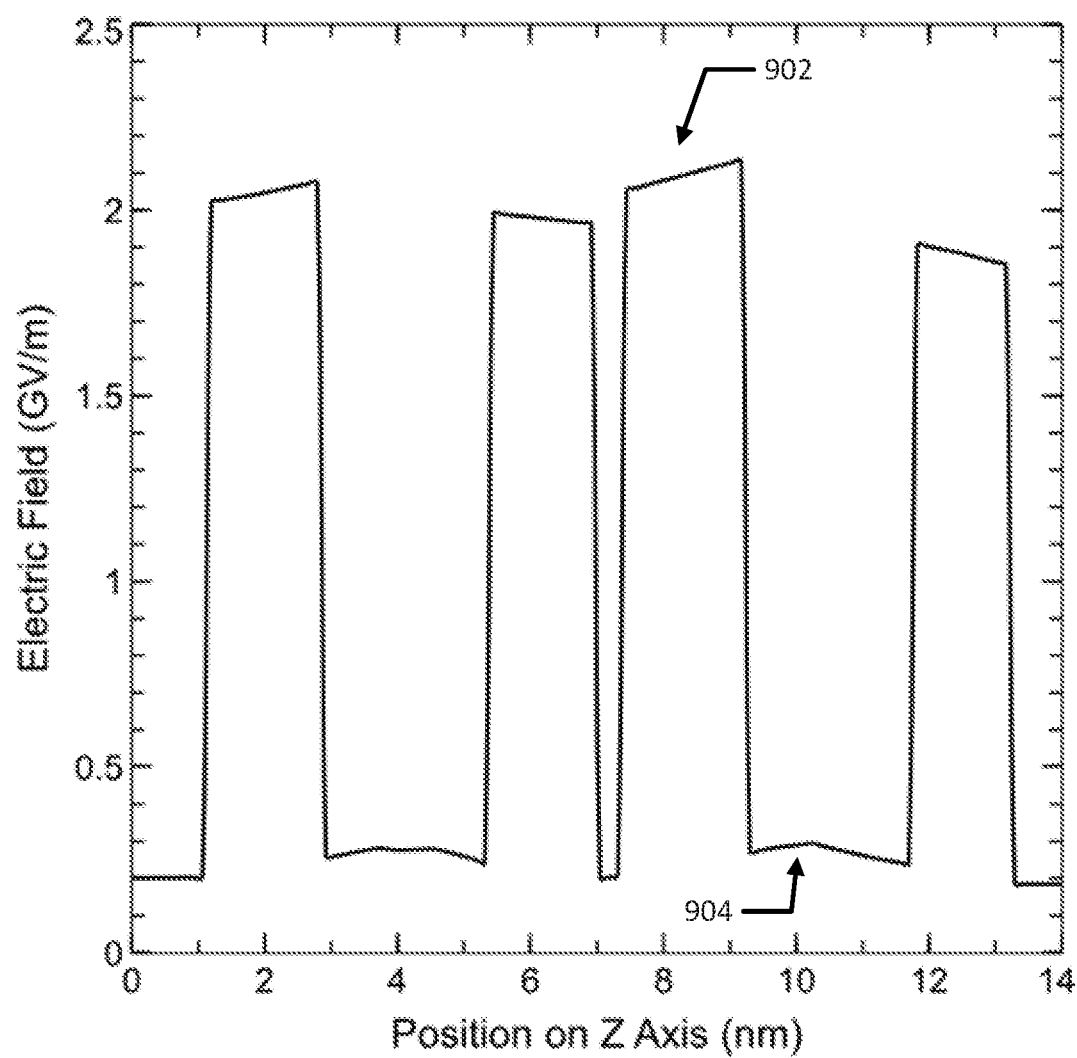

FIG. 14 is a plot of the electric field along the axis perpendicular to the electrodes 906 illustrated at line 1101 (Y=119.466; X=123; Z=0 to 14.5) in FIG. 11. The regions of pores 902 along the line of interest 1101 have field strengths between approximately 1.8 GV/m and 2.15 GV/m. The maximum field strength in the solid region 904 is slightly less than 0.3 GV/m while the minimum field in the solid matrix 904 is approximately 0.18 GV/m. Thus the ratio of the electric field in the pores 902 to the electric field in the solid matrix 904 can be calculated to range from 6 to 11.95.

The preceding figures and discussion establish that the three-dimensional laminar composite structure 900 can compress the electric field in low dielectric constant volumes of vacuum or gas when the aspect ratio of the vacuum or gas region is greater than four. Of greater importance than field compression alone is whether the field compression is sufficient to result in greater electrical energy storage density in the volumes of vacuum or gas than in the solid.

Figure 15:
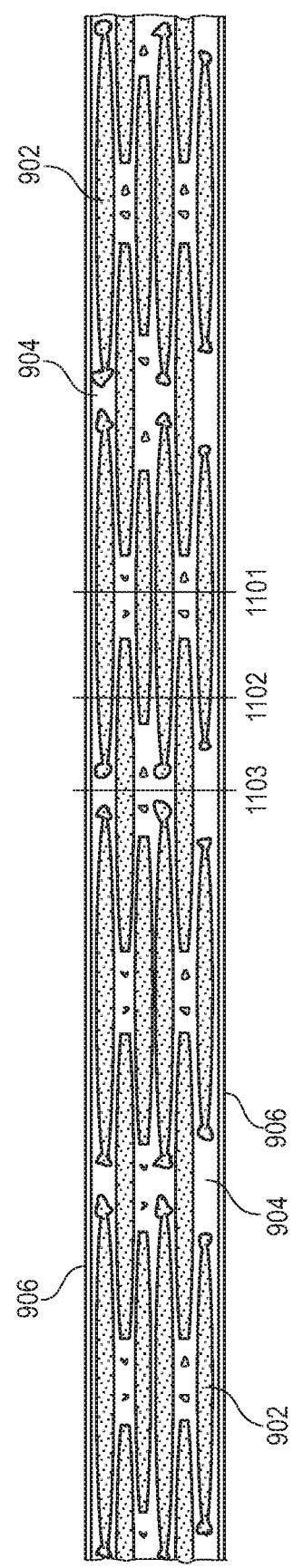
FIG. 15 is a plot of the electrical energy density on the two-dimensional cross-section of FIG. 10 of the composite structure of oblate spheroids of vacuum or gas pores in the solid matrix, in accordance with one embodiment of the present invention.
Figure 16:
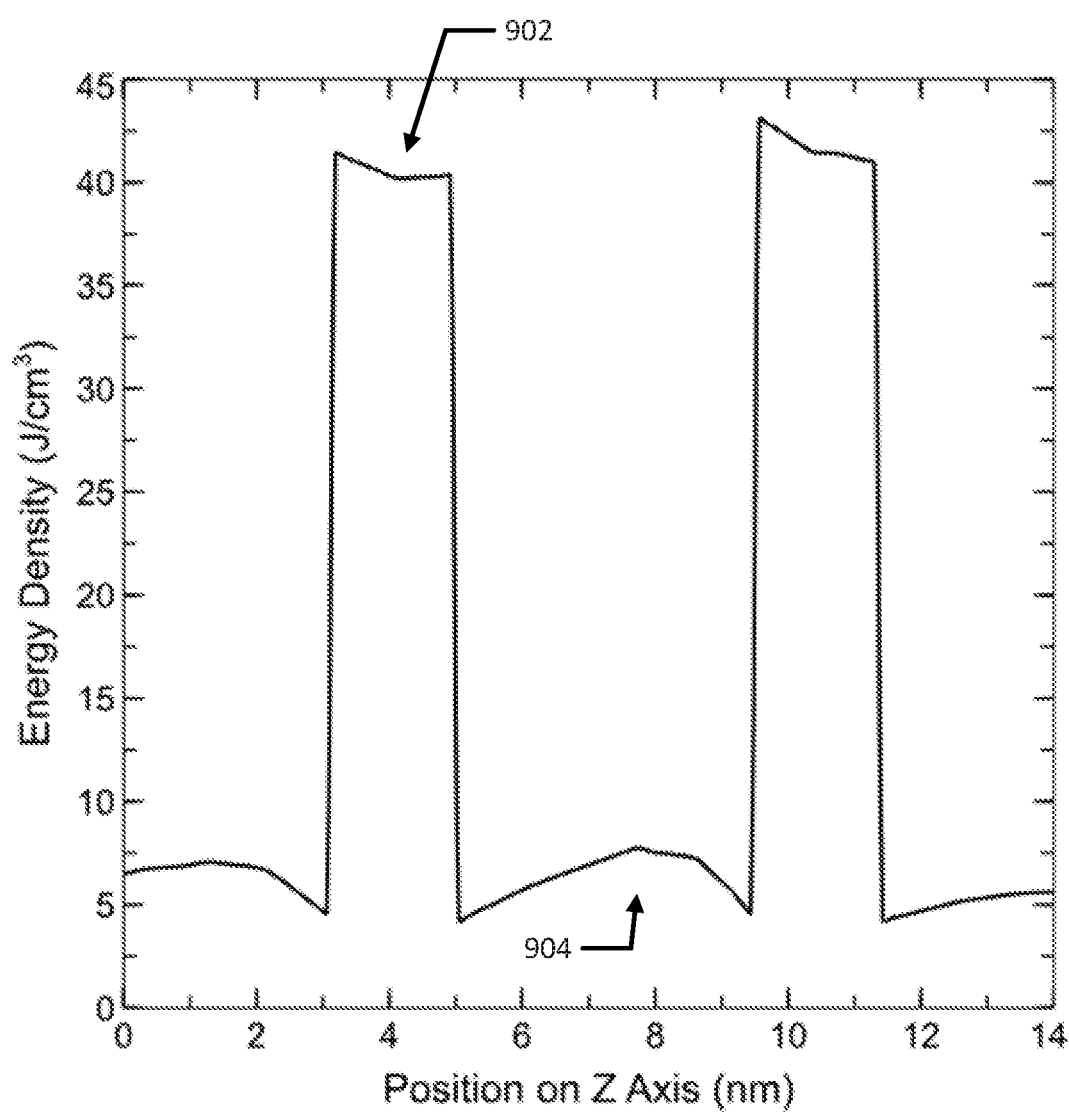
FIGS. 16-18 are plots of the electrical energy density along the axis perpendicular to the electrodes from the plot of FIG. 15, in accordance with embodiments of the present invention.
Figure 17:
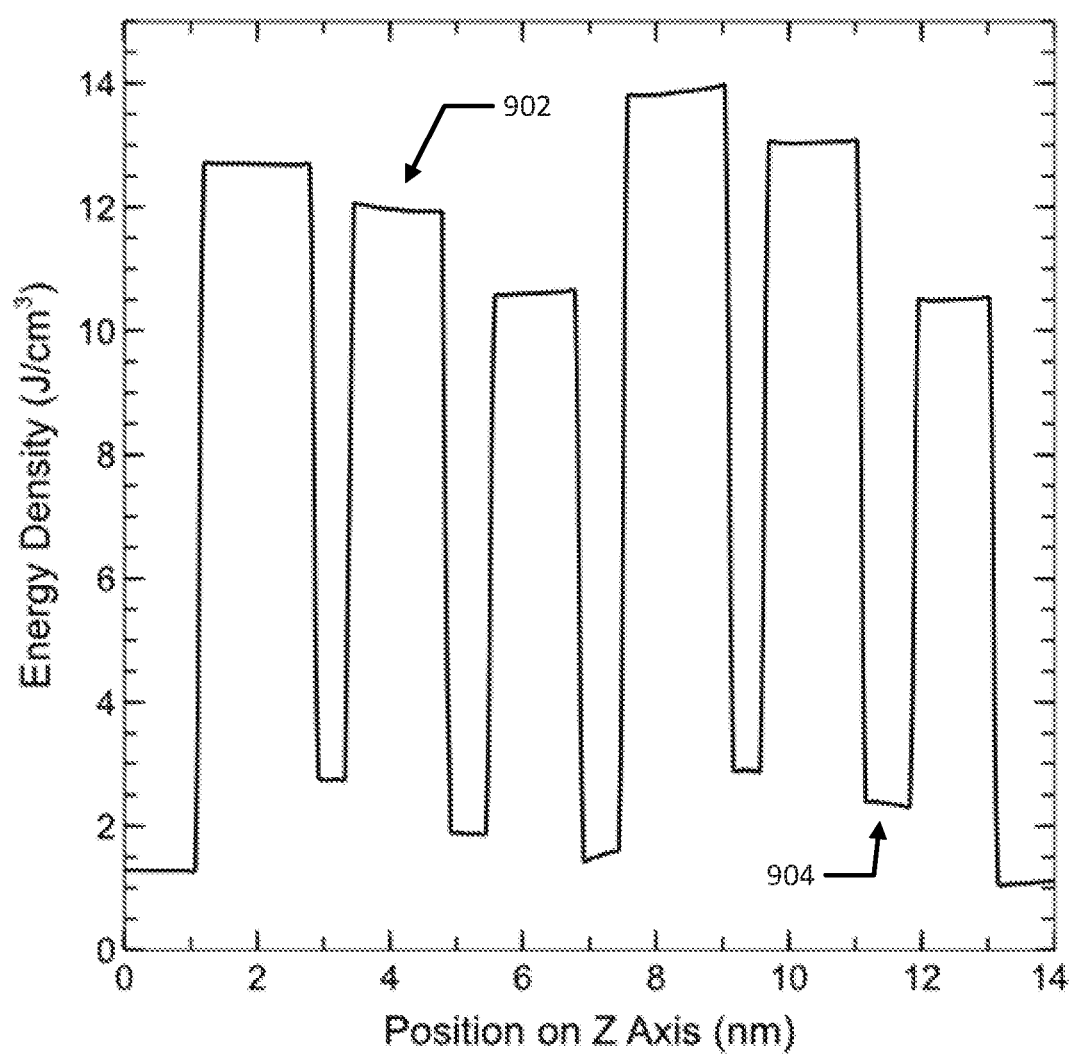
Figure 18:
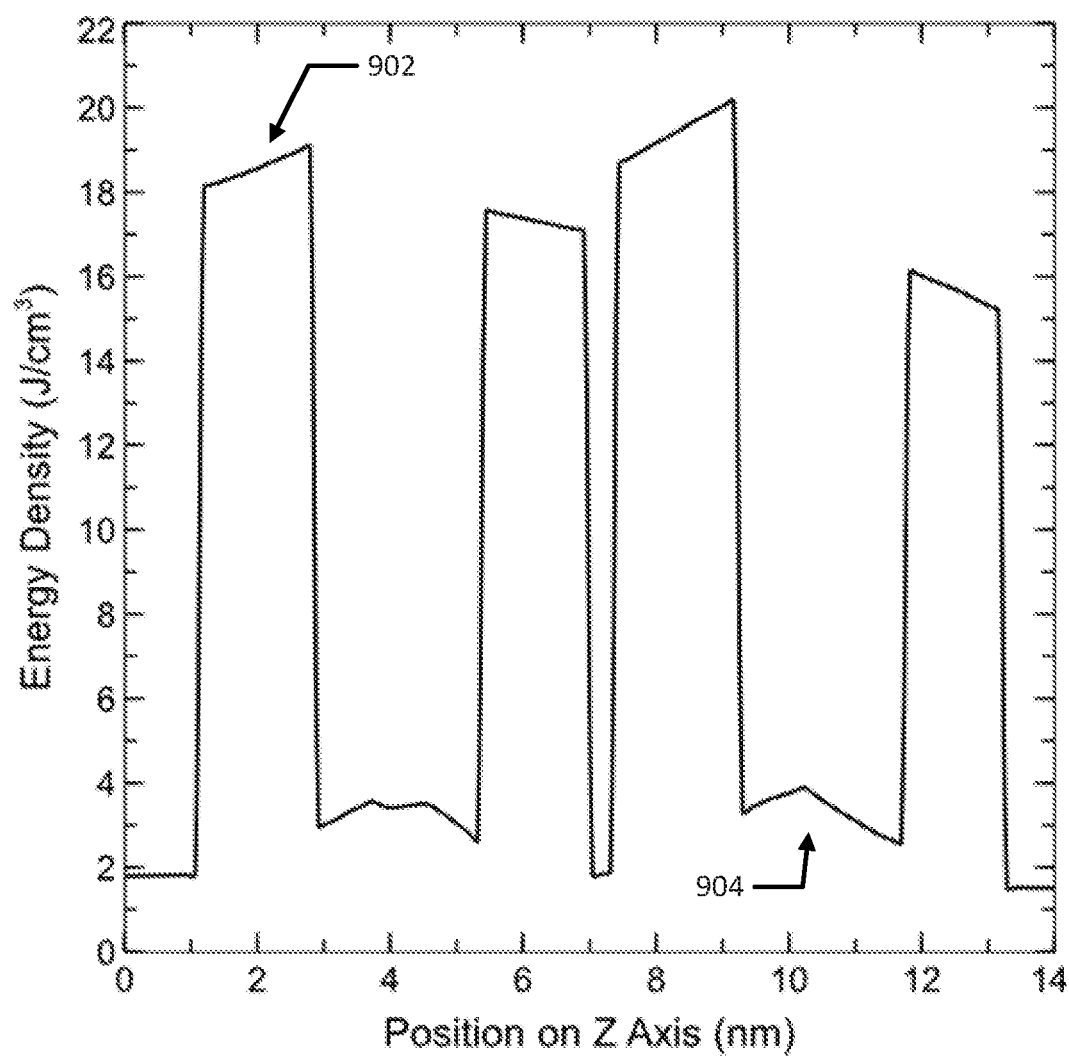

FIG. 15 shows the two-dimensional plot of the energy density of the same cross-section shown in FIG. 11. In FIG. 15, the shaded areas represent energy densities greater than or equal to 6 J/cm$^3$. FIGS. 16-18 plot the electrical energy density along the three lines 1101, 1102, 1103 shown in FIG. 15. FIGS. 16-18 correspond to the same lines in which the electric field was plotted to generate FIGS. 12-14.

FIG. 16 is a plot of the electrical energy density along the axis perpendicular to the electrodes 906 illustrated at line 1103 (Y=119.466; X=102; Z=0 to 14.5) in FIG. 15. In FIG. 16, the electrical energy density is significantly higher in the regions 902 occupied by vacuum or gas despite the lower dielectric constant than the solid matrix 904. The energy density in the vacuum or gas regions 902 is between 40 J/cm$^3$ and 43 J/cm$^3$. The energy density in the solid matrix 904 is between approximately 4.2 J/cm$^3$ and 7.75 J/cm$^3$.

FIG. 17 is a plot of the electrical energy density along the axis perpendicular to the electrodes 906 illustrated at line 1102 (Y=119.466; X=114; Z=0 to 14.5) in FIG. 15. The energy density in the vacuum or gas regions 902 is between approximately 10.5 J/cm$^3$ and 14 J/cm$^3$. The energy density in the solid matrix regions 904 is within a range from approximately 1.05 J/cm$^3$ to 2.9 J/cm$^3$.

FIG. 18 is a plot of the electrical energy density along the axis perpendicular to the electrodes 906 illustrated at line 1101 (Y=119.466; X=123; Z=0 to 14.5) in FIG. 15. The energy densities in the vacuum or gas regions 902 are between approximately 15.19 J/cm$^3$ and 20.15 J/cm$^3$. The energy density in the solid matrix regions 904 is in a range from approximately 1.5 J/cm$^3$ to 3.9 J/cm$^3$.

FIGS. 16-18 confirm that the electrical energy density in the vacuum or gas regions 902 is greater than the electrical energy density in the solid matrix regions 904 despite the higher dielectric constant in the solid ($\varepsilon_r=10$ in solid; $\varepsilon_r=1$ in vacuum or gas). Thus, the dielectric structures and the incorporation of vacuum or gas regions as described by embodiments of this invention enable larger energy densities to be achieved than with the use of solids alone. The energy densities described in the previous example are illustrative only and could be much higher. For example, the highest electric field in the solid observed in FIGS. 12 to 14 was approximately 0.42 GV/m (420 MV/m). This field level is below the dielectric strength of known solid dielectrics with dielectric constants similar to the value of ten used in the simulation, including but not limited to aluminum oxide and diamond. This implies that the voltage could be increased in the simulation while remaining within the known limits of the dielectric strength of the solid matrix 904. If the applied voltage is scaled by a factor of approximately 1.9, the maximum field in the solid matrix 904 increases to 0.8 GV/m (800 MV/m). This value is equivalent to the maximum dielectric strength in many anodized aluminum oxide films. Increasing the field by a factor of 1.9 increases the energy density by a factor of 3.6 in both the solid regions 904 and vacuum or gas regions 902. Thus, the energy density would scale in the vacuum or pore regions 902 of FIG. 17 to approximately 37.8 to 50.4 J/cm$^3$. The peak energy density predicted in FIG. 18 would increase to approximately 72.5 J/cm$^3$. As the theoretical value of breakdown of aluminum oxide is approximately 1.38 V/nm (1.38 GV/m), the electric field in the previous example could be scaled higher by a factor of 3.28, and the energy density would be scaled by a factor of over 10. Thus, the energy density in the vacuum or gas could exceed 100 J/cm$^3$.

The previous example was based on a composite structure 900 comprised of a solid matrix 904 with many pores 902 of vacuum or gas dispersed/distributed throughout the solid matrix 904. Another example embodiment of the present invention can be described as a composite structure comprised of a matrix of vacuum or gas with many particles 902 of solid dielectrics dispersed/distributed throughout the vacuum or gas matrix. This porous composite structure 900 can be embodied with high aspect ratio particles with the major axis of the particles generally perpendicular to the applied electric field and the minor axis generally parallel to the applied electric field. The particles in a preferred embodiment are platelets or flakes with aspect ratios of four or greater. Platelets and flakes can have irregular cross-sections in the plane that is generally perpendicular to the applied electric field, but the dimensions of the particles are on the same order of magnitude to be considered a platelet or flake. An alternative particle shape applicable to this embodiment is a ribbon-shaped particle in which one dimension of the particle in the plane perpendicular to the electric field, the length of the ribbon, is much larger than the other dimension of the particle in the plane perpendicular to the electric field, the width. The minimum aspect ratio of the particle is then determined by the width of the ribbon over the thickness of the ribbon. Other alternative embodiments can be comprised of a combination of platelets or flakes and ribbon-shaped particles. A variation of sizes and types of the particles may be chosen to control the structure and porosity in ways that a single particle size or particle type could not achieve.

Figure 19:
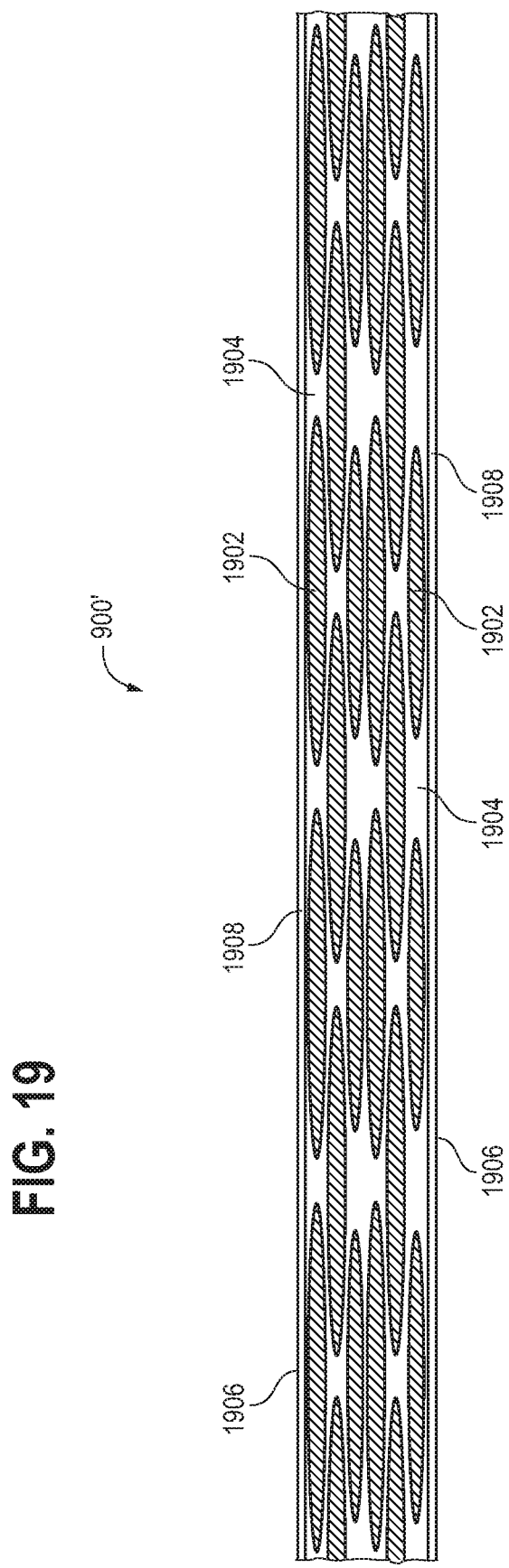
FIG. 19 is a cross-sectional view of a composite structure of oblate spheroids of solid particles in a matrix of vacuum or gas in accordance with one embodiment of the present invention.

An embodiment of a structure formed by high aspect ratio particles can be simulated with a similar model structure as that used in the previous example (e.g., FIGS. 9-18). However, as illustrated by the cross-sectional view of the second example embodiment of the composite structure 900' in FIG. 19, the material definitions are changed such that the oblate spheroidal regions 1902 are now defined to be the particles with a dielectric constant of ten, and the surrounding matrix 1904 is defined to be vacuum or gas with a dielectric constant of one. Since the matrix 1904 is now the vacuum or gas, solid insulating layers on the electrodes 1906 are added. A layer of solid insulation 1908 also with a dielectric constant of ten was included in the model between each electrode 1906 and the closest layer of high aspect ratio particles. FIG. 19 shows a cross-section view of the simulated composite based on high aspect ratio solid particles 1902 in a vacuum/gas matrix 1904 with solid insulation 1908 on the electrodes 1906. While the high aspect ratio particles 1902 are modeled as oblate spheroids (e.g., oblate spheroid 802, etc.) in this example embodiment, the shape of particles 1902 can take many forms, including those with a rectangular or nearly rectangular cross-section, for example, if the aspect ratio criteria is satisfied.

The simulated capacitor composite structure 900' has length and width dimensions of 226 by 204.5 nm in the example embodiment. The major dimension of the solid particles 1902 is 40 nm with a minor dimension of 2 nm for an aspect ratio of 20. The distance between particles 1902 along both axes parallel to the electrodes is 1 nm. Since the particles are self-supporting in the porous structure (i.e., the high aspect ratio particles 1902 are contacting each other to form the mechanical framework for the dielectric structure), the distance between particles 1902 along the axis parallel to the applied electric field is zero. In an embodiment, the thickness of electrodes 1906 is 0.01 nm (e.g., for purposes of an electrostatic simulation, etc.). The thickness of the solid insulating barrier layers 1908 on each electrode 1906 is 0.9 nm. The total dielectric thickness, including the solid layers, is 14 nm. The applied voltage was 15.25 V for an average electric field, when neglecting field compression between materials, of approximately 1.09 GV/m (1.09 V/nm). It is noted that this field level is higher than that typically applied to a solid insulator alone. In an embodiment, the high aspect ratio solid particles 1902 and/or solid insulating layers 1908 are comprised of at least one of a metal oxide, diamond, or nitride. In another embodiment, the high aspect ratio solid particles 1902 and/or solid insulating layers 1908 are comprised of at least one of alumina, diamond, tantalum oxide, hafnia, niobia, titania, silica, silicon nitride, boron nitride, or aluminum nitride. In an embodiment, the gas matrix 1904 is comprised of one or more of air, nitrogen, sulfur hexafluoride, oxygen, hydrogen, carbon dioxide, perfluorocarbons, or chlorofluorocarbons. In an embodiment, the electrodes 1906 are comprised of an electrode conductor, and wherein the electrode conductor is a metal, a semiconductor material, a liquid electrolyte, or a solid electrolyte. In another embodiment, the electrodes 1906 are comprised of an electrode conductor, and wherein the electrode conductor is at least one of aluminum, carbon, hafnium, niobium, silicon, titanium, nickel, silver, gold, or tantalum.

Figure 20:
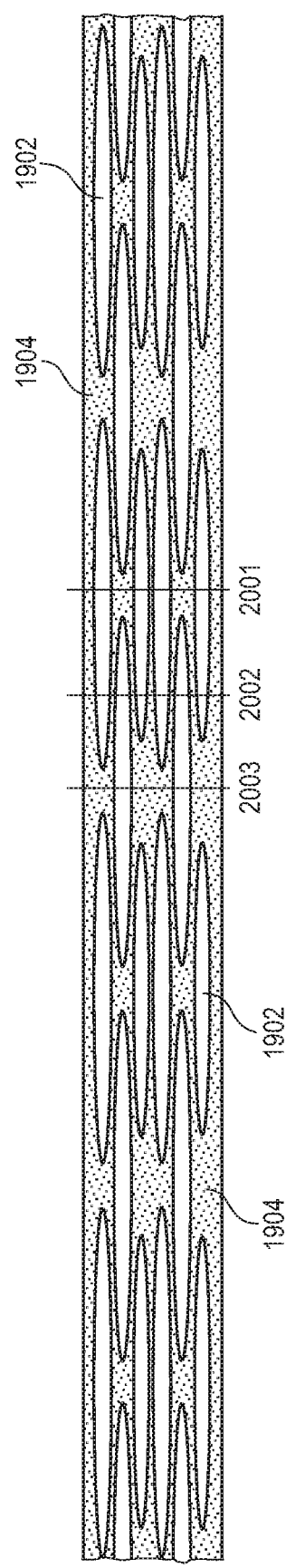
FIG. 20 is a plot of the absolute value of an electric field on the two-dimensional cross-section of FIG. 19 of the composite structure of oblate spheroids of solid particles in a matrix of vacuum or gas, in accordance with one embodiment of the present invention.

FIG. 20 is a plot of the absolute value of an electric field on the two-dimensional cross-section of FIG. 19 of the composite structure of oblate spheroids of solid particles 1902 ($\varepsilon_r=10$) in a matrix of vacuum or gas 1904 ($\varepsilon_r=1$) (Y=119.446), in accordance with an embodiment. From FIG. 20, it is evident that the electric field in the solid particles 1902 formed by the oblate spheroids is much lower than the electric field in the surrounding vacuum or gas regions 1904. Similarly, the electric field in the solid barriers 1908 on the electrodes 1906 is much lower than the fields in the vacuum or gas regions 1904. The shaded region in FIG. 20 represents regions with an electric field greater than 1 GV/m. These shaded regions correspond to the regions of vacuum or gas 1904.

Figure 21:
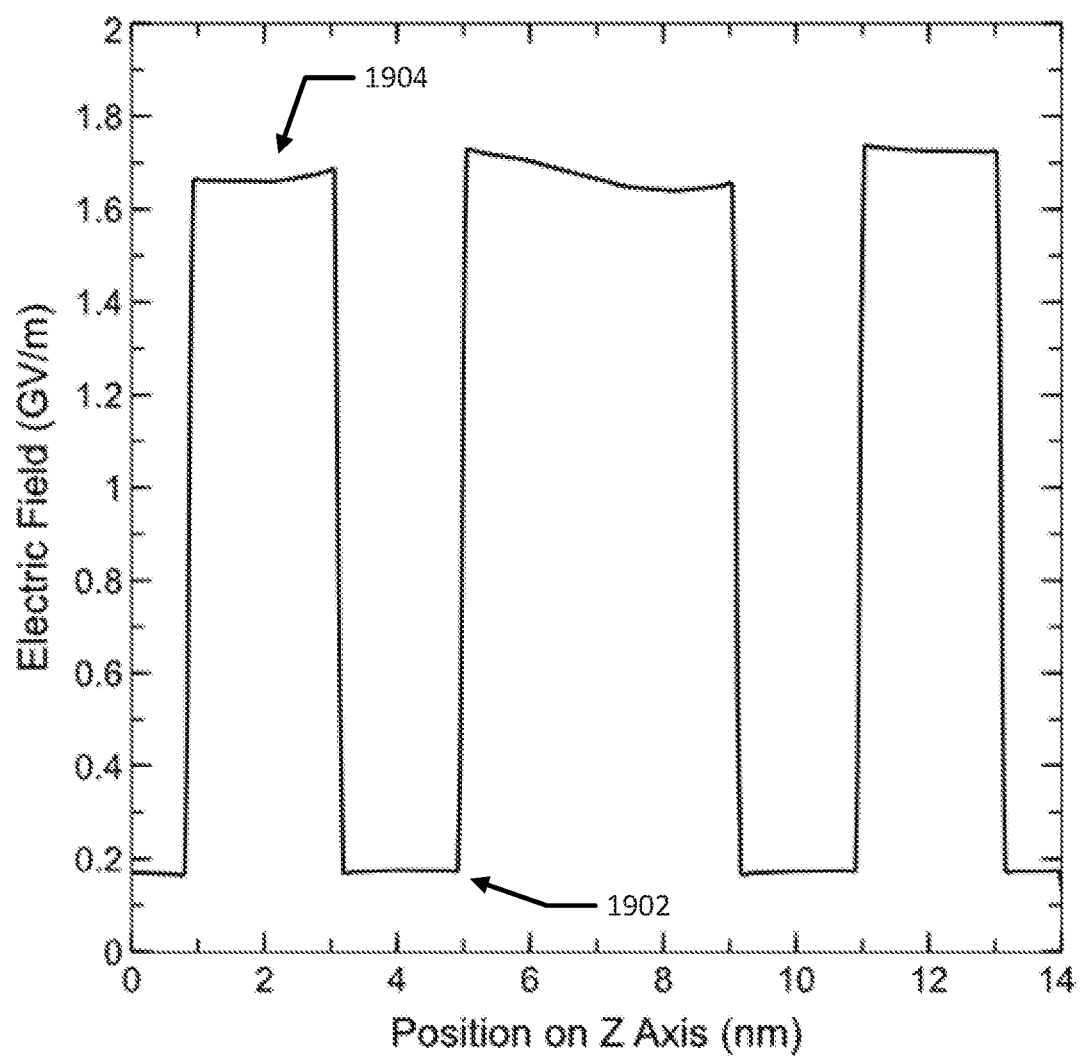
FIGS. 21-23 are plots of the electric field along the axis perpendicular to the electrodes from the plot of FIG. 19, in accordance with embodiments of the present invention.
Figure 22:
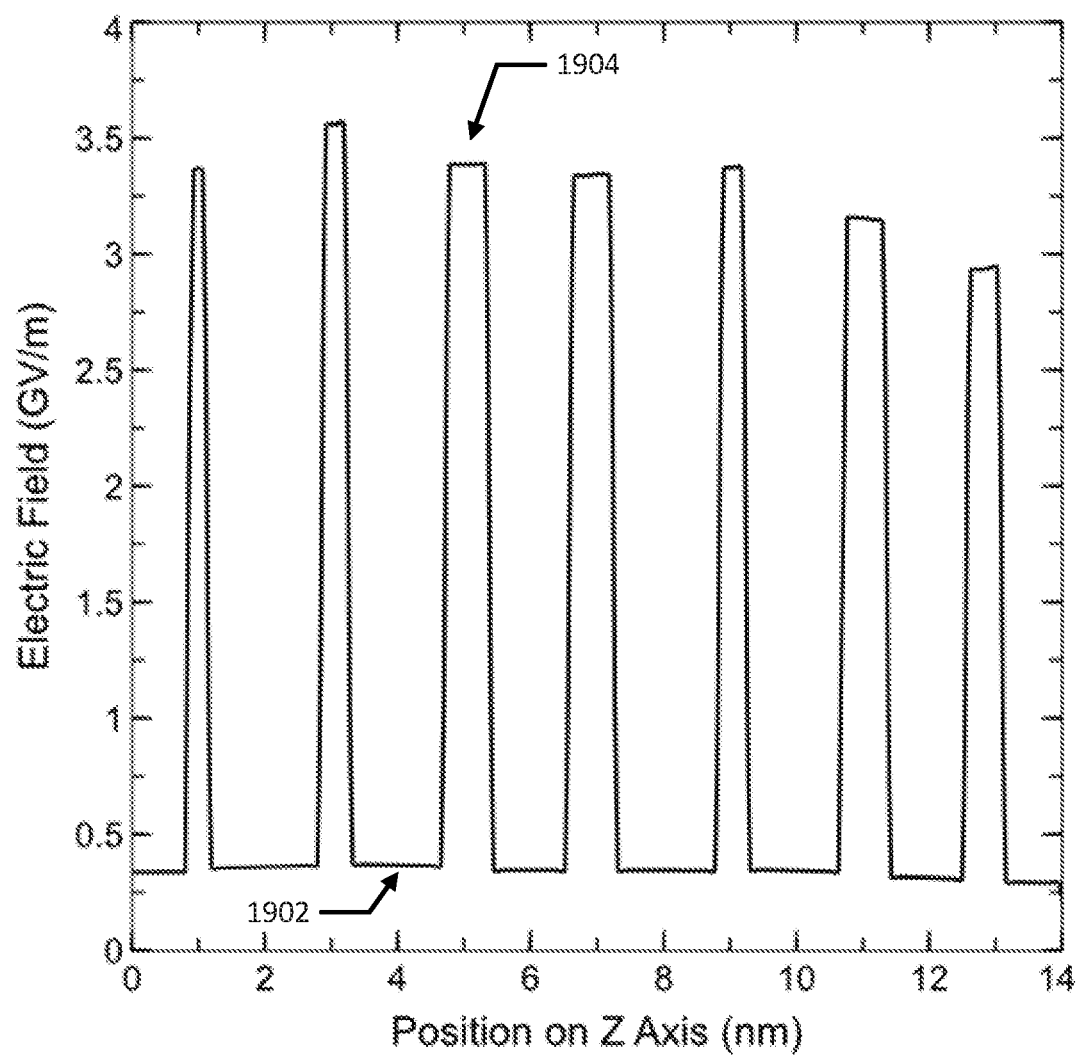
Figure 23:
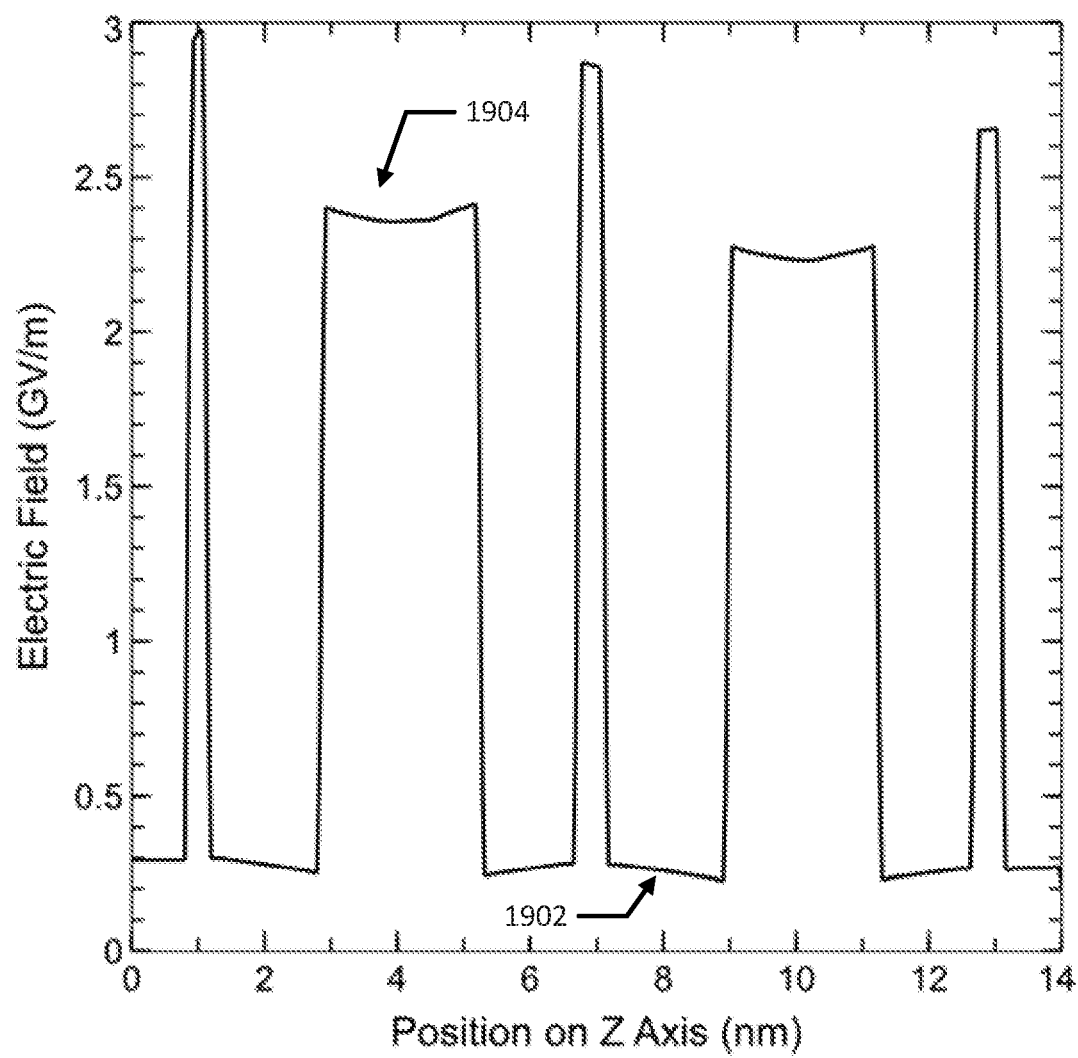

FIGS. 21-23 plot the electric field along the z-axis running perpendicular to the plane of the electrodes 1906. The three graphs in FIGS. 21-23 show the differences between the field levels in the solid barrier 1908 on the electrodes 1906, the vacuum/gas regions 1904, and the solid particles 1902. In all three cases, the field levels in the solid layers 1908 and solid particles 1902 are below 400 MV/m (0.4 V/nm) while the field is enhanced in the vacuum or gas regions 1904 to levels greater than 1.5 GV/m (1.5 V/nm).

FIG. 21 is a plot of the electric field along the axis perpendicular to the electrodes illustrated at line 2003 (Y=119.446; X=102; Z=0 to 14) in FIG. 20. As illustrated in FIG. 21, the electric field in the vacuum/gas regions 1904 is between 1.63 GV/m and 1.73 GV/m. The electric field in the solid regions 1902 is approximately an order of magnitude lower at less than 0.175 GV/m.

FIG. 22 is a plot of the electric field along the axis perpendicular to the electrodes illustrated at line 2002 (Y=119.446; X=114; Z=0 to 14) in FIG. 20. Compared to FIG. 21, the electric field levels are higher in the region plotted in FIG. 22 as the fields in the vacuum/gas regions 1904 range between approximately 2.3 and 3.56 GV/m. The electric field in the solid regions 1902 is in a range from 0.29 to 0.343 GV/m.

FIG. 23 is a plot of the electric field along the axis perpendicular to the electrodes illustrated at line 2001 (Y=119.446; X=123; Z=0 to 14) in FIG. 20. In the graph of the electric field shown in FIG. 23, the electric field in the vacuum/gas regions 1904 is between 2.23 and 2.97 GV/m. The electric field in the solid regions 1902 is between 0.227 and 0.304 GV/m. As FIGS. 21-23 demonstrate, the electric field in the solid regions 1902 is kept lower than the breakdown threshold of many solid insulators while the field in the vacuum/gas regions 1904 is enhanced to levels higher than those used in conventional dielectrics. FIGS. 24-27 show the corresponding energy density values to the electric field graphs in FIGS. 20-23.

Figure 24:
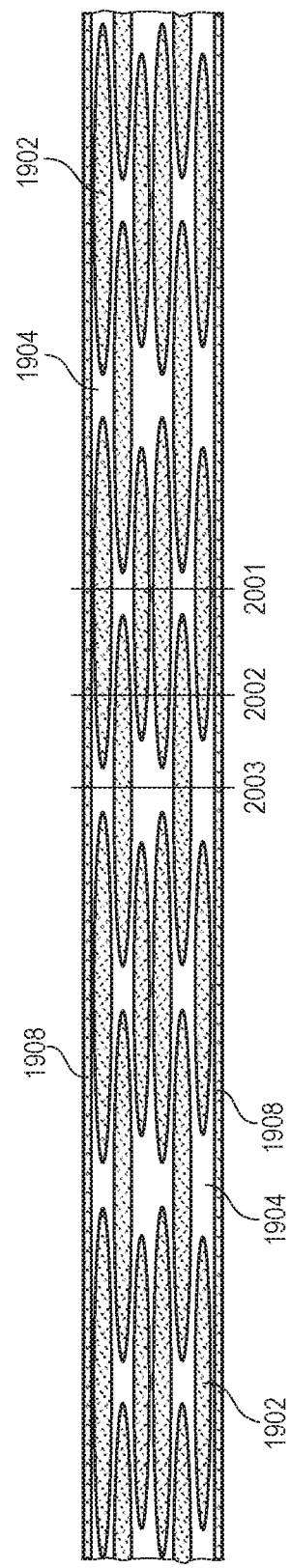
FIG. 24 is a plot of the electrical energy density on the two-dimensional cross-section of FIG. 19 of the composite structure of oblate spheroids of solid particles in a matrix of vacuum or gas, in accordance with one embodiment of the present invention.
Figure 25:
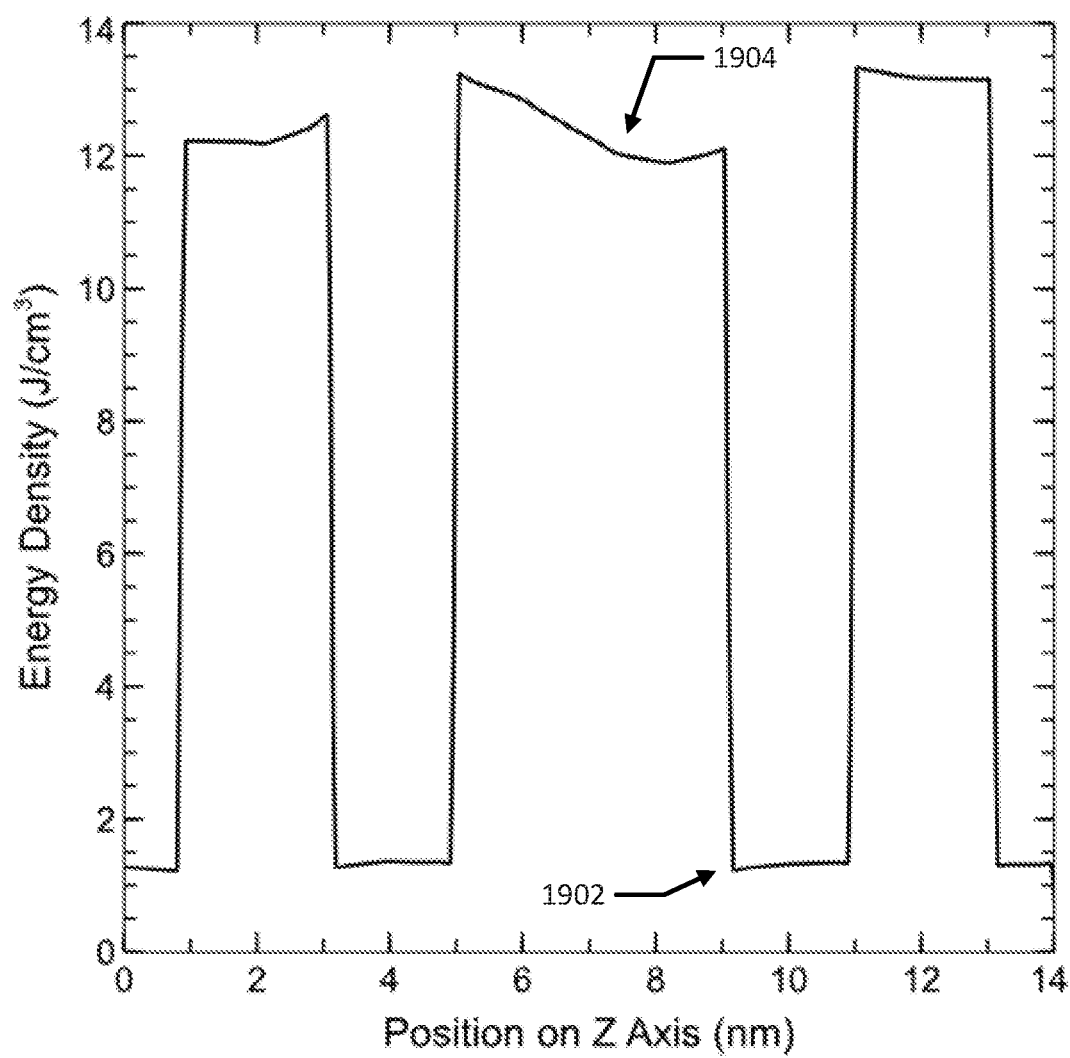
FIGS. 25-27 are plots of the electrical energy density along the axis perpendicular to the electrodes from the plot of FIG. 19, in accordance with embodiments of the present invention.
Figure 26:
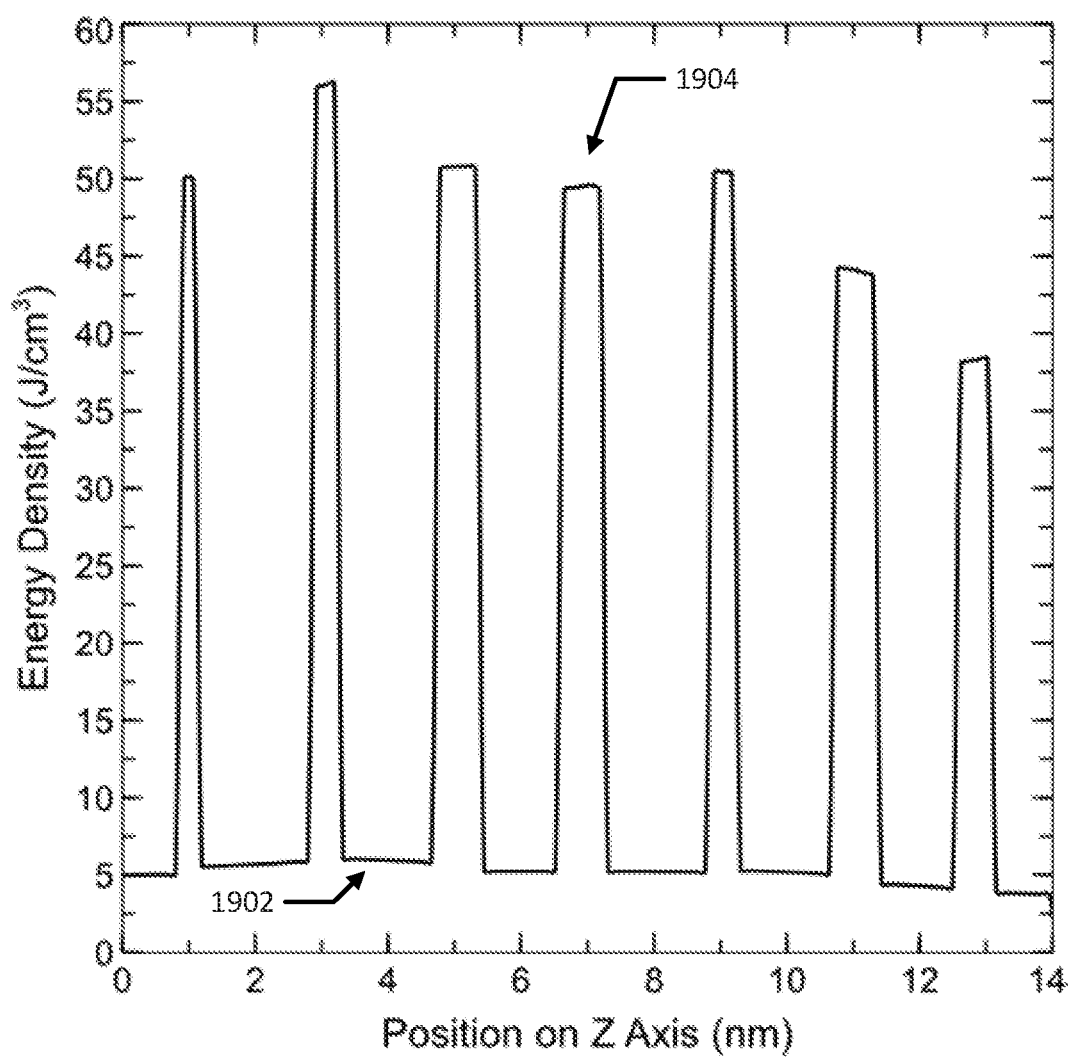
Figure 27:
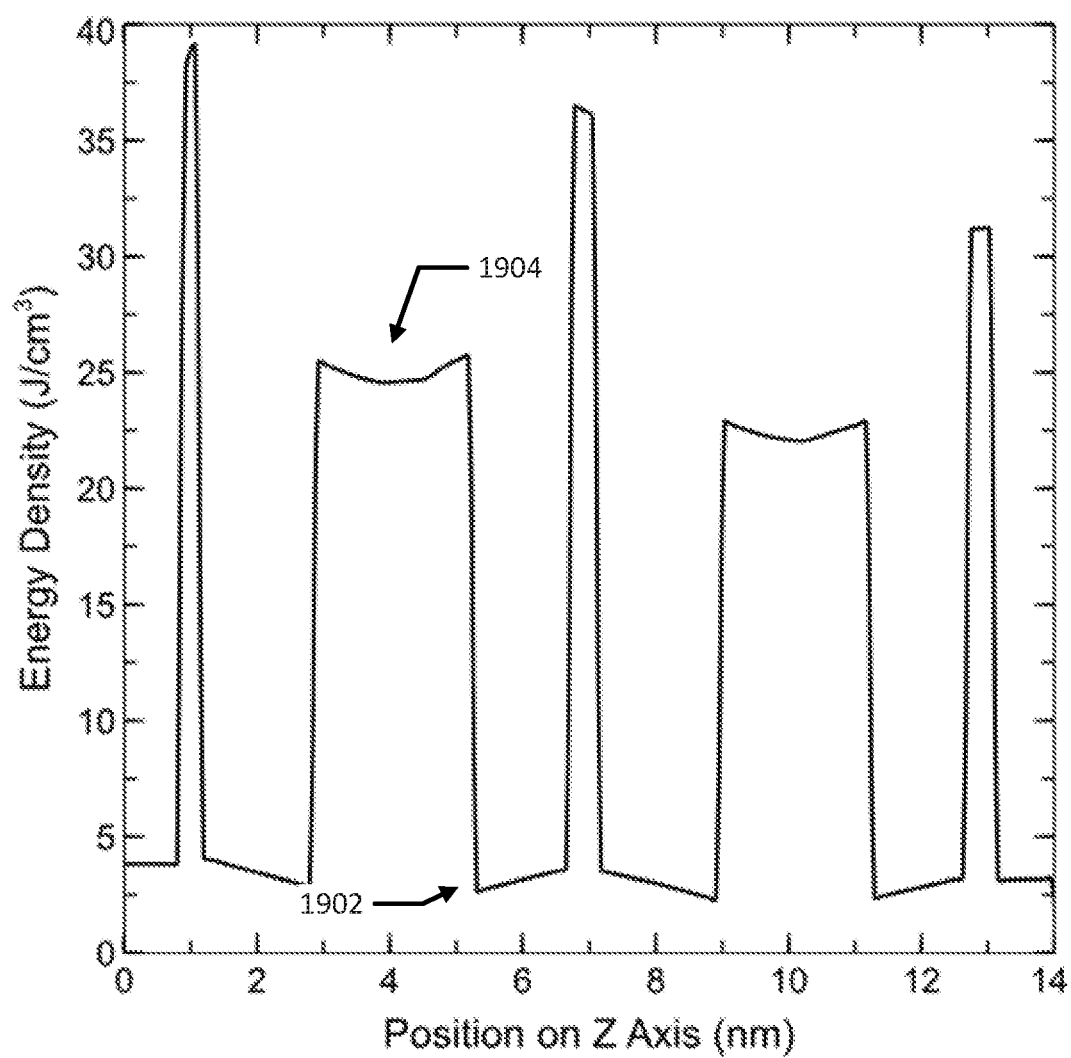

FIG. 24 shows the two-dimensional plot of the energy density of the same cross-section shown in FIG. 19. As seen by the shading difference from the solid layers 1908 and solid particles 1902 to the surrounding gas or vacuum regions 1904, the electrical energy density is higher in the vacuum gas regions 1904 than that reached in the solid regions 1902 and 1908. In FIG. 24, the non-shaded regions, corresponding to the regions of vacuum or gas 1904, represent an electrical energy density greater than or equal to 7 J/cm³. The graphs in FIGS. 25-27 plot the electrical energy density following the same three lines 2001, 2002, 2003 along the z-axis as the one-dimensional electric field plots. The higher electric field levels in the vacuum or gas regions 1904 result in up to an order of magnitude higher energy storage density in the vacuum/gas regions 1904 than in the solid regions 1902 and 1908.

FIG. 25 is a plot of the electrical energy density along the axis perpendicular to the electrodes 1906 illustrated at line 2003 (Y=119.446; X=102; Z=0 to 14) in FIG. 24. As shown in FIG. 25, the electrical energy density in the vacuum/gas regions 1904 is in a range from 11.9 to 13.3 J/cm³. The electrical energy density in the solid regions 1902 and 1908 is 1.21 to 1.36 J/cm³.

FIG. 26 is a plot of the electrical energy density along the axis perpendicular to the electrodes 1906 illustrated at line 2002 (Y=119.446; X=114; Z=0 to 14) in FIG. 24. In FIG. 26, the electrical energy density in the vacuum/gas regions 1904 and 1908 is between 38.1 and 56.2 J/cm³. The electrical energy density in the solid regions 1902 and 1908 is between and 3.74 and 6.07 J/cm³.

FIG. 27 is a plot of the electrical energy density along the axis perpendicular to the electrodes 1906 illustrated at line 2001 (Y=119.446; X=123; Z=0 to 14) in FIG. 24. In FIG. 27, the electrical energy density in the vacuum/gas regions 1904 is between 22.0 and 39.1 J/cm³. The electrical energy density in the solid regions 1902 is between 2.29 and 4.11 J/cm³.

As with the previous example embodiment of vacuum/gas pores 902 in a solid matrix 904, this example embodiment of solid particles 1902 in a vacuum/gas matrix 1904 with solid insulating layers 1908 adjoining (i.e., adjacent to) the electrodes 1906 has confirmed that the electrical energy density in the vacuum or gas regions is greater than the electrical energy density in the solid matrix regions despite the higher dielectric constant of the solid ($\varepsilon_r$=10 in solid; $\varepsilon_r$=1 in vacuum or gas). The energy densities described in the previous example are illustrative only and could be much higher. For example, the highest electric field in the solid regions 1902 and 1908 observed in FIGS. 21-23 was approximately 0.343 GV/m. This field level is below the dielectric strength of known solid dielectrics with a dielectric constant similar to that used in the simulation, including but not limited to aluminum oxide and diamond. This implies that the voltage could be increased in the simulation while remaining within the known limits of the dielectric strength of the solid particles and solid insulation layers. If the applied voltage is scaled by a factor of 2.3, the maximum field in the solid particles increases to approximately 800 MV/m, which is a value equivalent to the maximum dielectric strength in many anodized aluminum oxide films. Increasing the applied voltage and thus the electric field by a factor of 2.3 increases the energy density by a factor of 5.29 in both the solid regions 1902 and 1908 and vacuum/gas regions 1904. Thus, the energy density would scale in the vacuum/gas regions 1904 of FIG. 26 to greater than 200 J/cm³. As the theoretical value of breakdown of aluminum oxide is approximately 1.38 V/nm (1.38 GV/m), the electric field in the previous example could be scaled by a factor as high as 4, corresponding to a scaled energy density by a factor of 16, while being within the breakdown limits of aluminum oxide. Thus, extremely high electrical energy densities could be achieved in the vacuum/gas regions.

The preceding examples considered ideal dielectrics in which the conductivities are zero. In those situations, the distribution of the electric field within the capacitive structure is determined by the dielectric constants and physical arrangements of the materials comprising the structure. For some solid insulators, particularly over long time scales or very low frequencies of operation, the conductivity of the insulators is non-negligible, and conduction through the solid may have effects on the distribution of the electric fields. However, even in these cases, the structures of embodiments of the present invention compress the electric field in the vacuum or gas regions.

In the case of the layered structure (see FIGS. 3-7), charge movement within the solid insulators would progress to cancel the applied electric field within the solid layers. In the most extreme case, the field would be completely cancelled in the solid layers, and the full applied voltage would drop across the vacuum or gas layers. This would have the effect of increasing the energy density in the vacuum or gas layers and the ratio of energy stored in the vacuum or gas layers to the energy stored in the solid layers. Despite this apparent advantage, the preferred embodiments comprise solid insulators with very low conductivity as charge movement within the solid insulator would contribute to losses.

In the case of a three-dimensional matrix of the solid insulator with an aspect ratio greater than four with pores dispersed or distributed throughout the matrix (see FIGS. 9-18), the preferred embodiments again comprise solid insulators with very low conductivity to limit the leakage current. However, the electric field will still be compressed in the pores of vacuum or gas even when the effects of the solid insulator conductivity are non-negligible. This compression of the electric field is again due to the aspect ratio of the pores. When considering the voltage drop across the center of a pore, the resistive voltage drop is dependent on the long and tortuous path through the solid insulator extending around the surface of the pore. The field within the pore is determined by the difference in the potential on either side of the pore. For a larger aspect ratio, the path around the pore through the solid becomes very long relative to the path through the vacuum or gas of the pore. Therefore, the voltage drop due to resistive conduction in the solid along the relatively long path around the pore is applied across the relatively short distance of the pore along the axis of the applied field. The field in the vacuum or gas is higher than the field in the solid matrix, so field compression and higher electrical energy density is still achieved in the pore. The same effect is achieved in the case of solid particles of high aspect ratio in a matrix of vacuum or gas (see FIGS. 19-27). The long and tortuous conduction path through the high aspect ratio pores compresses the electric field into the relatively short distance across the vacuum or gas regions between the solid particles.

Additional Benefits—Several areas of improvement were identified herein for dielectrics, including density metrics for energy, power, and capacitance, operation at extreme temperatures, compatibility with temperature cycling, stability of properties with respect to temperature, applied voltage/electric field, and frequency, dielectric losses, reliability, and compatibility with self-clearing methods. The dielectric structures of embodiments of the present invention provide multiple advantages over conventional dielectrics known in the art. The energy density advantage has been established in the simulation of the example embodiments as the energy density levels in the vacuum/gas regions exceed values attainable with solid dielectrics. The high energy density values correspond to high power density values due to the electrostatic (i.e., not electrochemical) nature of the energy storage. The dielectric structure can be quickly charged and discharged, enabling a high power density. Since the dielectric structures of embodiments of the present invention can operate at higher electric field levels than solid dielectrics, the dielectric structure can be made thinner than conventional solid dielectrics for an equivalent applied voltage. While the equivalent dielectric constant of the dielectric structures of embodiments of the present invention is lower than the dielectric constant of conventional solid dielectrics, the smaller thickness of the dielectric can result in a higher capacitance density ($F/m^2$) than that achieved with a conventional solid dielectric. The higher capacitance density enables the fabrication of a capacitor of a rated capacitance with a smaller area of the dielectric (i.e., smaller length and/or width). The thinner dielectric and smaller capacitor area directly result in the decreased size and weight of a capacitor based on the porous dielectric compared to those produced with a conventional solid dielectric. The decreased size and weight for an equivalent capacitance and voltage rating correspond to the higher energy and power densities of devices made with the dielectric structures.

In some applications, higher energy and/or power density are not required, but there are additional advantages over conventional dielectrics in the art due to the use of the dielectric structures of embodiments of the present invention. Many of these advantages are due to the compression of the electric field into the vacuum/gas regions and thus the majority of the energy being stored in the vacuum/gas regions. These benefits can be explained by the relative absence of polarizable molecules within a vacuum or gas dielectric when compared to liquid or solid dielectrics.

Dielectric losses originate from the difference between the applied electric field and the induced polarization of the dielectric. Dielectric losses tend to be higher for highly polar materials and at higher frequencies of the applied field. Since vacuum has no polarized atoms or molecules, there is no source for dielectric losses. While the atoms and molecules of gases can be polarized, the relatively low density of atoms or molecules per unit volume mean the dielectric constant is very close to one and the losses are very low in comparison to liquids or solids. Thus, by using vacuum or gas in the regions where much of the energy is stored, the dielectric losses are lower than those obtained from a liquid or solid dielectric.

Variation of dielectric properties with the applied voltage, frequency, or operating temperature is a critical parameter for many capacitor applications. Vacuum, with a dielectric constant of exactly 1, and gas, with a dielectric constant very slightly larger than 1 (e.g., $\varepsilon_{dry\ air}=1.00059$; $\varepsilon_{N2}=1.00054$; $\varepsilon_{O2}=1.00049$; $\varepsilon_{SF6}=1.002$) have either no variation (vacuum) or very little variation (up to fractions of 1% for gases) with respect to the applied voltage/electric field, frequency, and operating temperature. Thus the dielectric structures of embodiments of the present invention have very stable properties, including capacitance and energy density, over a wide range of applied voltage/electric fields, frequencies, and operating temperatures.

The capability of operation at high and low temperatures is critical in many applications requiring service in extreme environments. The dielectric constant and dielectric strength of vacuum are not a function of temperature. Similarly, the dependence of the dielectric constant of gas has very weak dependence on temperature. The dielectric strength of gas at the size scales in each vacuum/gas region is not due to electron avalanche phenomena, which may have a temperature dependence, as previously described, so the breakdown of vacuum/gas regions does not have a strong temperature dependence. Therefore, only the electrode and solid insulating materials forming the structure will place limitations on the operating temperature of a capacitive structure incorporating vacuum or gas regions. In many embodiments using a metallic electrode and stable insulating solid dielectric, the temperature of operation can exceed industrial requirements. For example, a capacitor formed with a dielectric structure of aluminum oxide and dry nitrogen gas at a partial vacuum pressure with aluminum electrodes could operate at temperature higher than polymer dielectrics. The melting temperature of aluminum is approximately 660 C, and the sintering temperature of aluminum oxide, which could cause alteration of the dielectric structure, is typically well above 1000 C.

While the earlier discussion on energy and power density was primarily in terms of volume, embodiments of the present invention also provide an increased advantage in reducing weight. By requiring a smaller amount of electrically insulating material, the weight is directly reduced. In addition, since a significant percentage of the dielectric is composed of vacuum or gas, the weight of the device will be lower than a capacitor of the same size comprised of liquids or solids. The unique use of vacuum or gas in insulation that is conventionally comprised of solids reduces the weight even if the volume is the same.

Self-clearing or self-healing is used in high energy density capacitors to enable graceful failure through the gradual decrease of capacitance by means of isolating failure points in a dielectric as opposed to the abrupt and often permanent failure of a shorted dielectric that is not isolated. Embodiments of the present invention are compatible with the previously developed techniques for self-clearing or self-healing for solid insulators that are known in the art but also provides additional design elements to further improve self-clearing performance over solid dielectrics in at least two ways. First, since the preferred embodiments are not based on polymer dielectrics, the residual products formed from the heating at the site of the failure do not result in the production of graphite or other conductive carbon-based materials. This reduces or eliminates leakage current at failure sites, which can contribute to higher losses or premature failure of the device. Second, the porous structure allows for the introduction of various gases or even liquids to be incorporated into the dielectric structure that could aid in the self-clearing process. Selection of the gas in the pores can be made to enhance the vaporization and/or oxidation of the electrode metallization. For example, incorporating a gas mixture with oxygen as a component could enable oxidation of the electrode metallization to an insulator when heated to high temperatures consistent with a failure or other 'hot spot' that is subject to failure. Other gases may also be incorporated to chemically react with the electrode metallization or the porous structure to enhance self-clearing or self-healing capabilities. Depending on the types of electrodes used in certain embodiments of the invention, either or both methods may be used to create a self-healing device.

In some applications, component reliability is a higher priority than energy or power density. As previously described, conventional dielectrics are operated at a derated level from their maximum operating levels (e.g., operation at an electric field much lower than the measured breakdown strength of the dielectric) to increase the lifetime of the component and/or enable operation in extreme environments (e.g., high temperature environments). The lifetime or reliability of dielectrics is higher when the derating factor is increased (i.e., the dielectric is operated at a lower level from its maximum). By having a higher maximum operating electric field due to the higher dielectric strength, the dielectric structure of embodiments of the present invention can be operated with a higher derating factor than conventional dielectrics operating at comparable electric field levels. Thus, the reliability or lifetime of the dielectric can be increased compared to conventional dielectrics.

Methods to Manufacture the Porous Structure—There are multiple methods of manufacture to produce capacitive structures meeting the specifications described herein. Three exemplary methods are described herein: (1) amphiphilic block copolymers; (2) assembly of high aspect ratio particles; and (3) nanolithography. Each of these approaches is described separately. Those of ordinary skill in the art will understand that the manufacturing methods described herein are exemplary and non-limiting.

In an embodiment, the capacitive structures described herein are manufactured by amphiphilic block copolymers that self-assemble to produce ordered porous structures. These porous structures are formed from a sol-gel mixture of metal oxides or other materials to form a solid matrix and amphiphilic block copolymers which self-assemble into a three-dimensional network. The sol-gel mixture can be applied to a substrate through many means in which a liquid solution can be applied to a solid surface, including dip coating, spray coating, printing, slot-die coating, or any other application method known in the art. To form a capacitive structure, the sol-gel mixture may be applied to an electrode substrate with or without a solid insulating layer preformed on the electrode. When the electrode has an insulating layer, the insulating layer may be formed from oxidation or anodization or other chemical reaction of the electrode, deposition of an insulating layer through chemical or physical methods, or another means of applying an insulator to a conductor. The conductor may be etched to increase the surface area. For example, in one embodiment, the electrode may be chosen to be an aluminum foil. The aluminum foil may be etched to increase the surface area of the foil, and the insulating layer may be formed as aluminum oxide through oxidation or anodization or other chemical reaction of the foil surface. After a layer of the sol-gel mixture has been applied to the electrode or insulator surface, the amphiphilic block copolymers self-assemble into an ordered network. By heating the sol-gel layer, the block copolymers can be removed from the assembly without removing the matrix structure. Heating of the assembly can also anneal or sinter the matrix structure to improve its mechanical stability and other properties characteristic of the chosen matrix material. By controlling the properties of the sol-gel mixture and heating process, the porous structure can be made to partially contract during heating such that the aspect ratio of the pores left by the removal of the amphiphilic block copolymers is larger than four. Optimization of the choice of materials and processes may enable aspect ratios large enough to adequately compress the electric field in the vacuum or gas pores. The second electrode, with or without a solid insulating coating, may be applied by several means, including sputtering a metal onto the porous solid matrix, other chemical or physical deposition methods, or in the form of a solid or liquid electrolyte. Alternatively, a second foil, with or without an insulating layer and further with or without a porous solid matrix, may be applied on top of the first porous solid matrix.

A second technique of producing capacitive structures of embodiments of the present invention includes packing high aspect ratio particles, including platelets, flakes, or ribbons, such that their longer dimensions are generally perpendicular (e.g., within forty-five degrees of perpendicular, etc.) to the applied electric field and the shortest dimension (e.g., the thicknesses of the particles) are generally parallel to the applied electric field. Due to the imperfect packing of the particles, pores exist between particles, and the pores also have a high aspect ratio with the longer dimension of the pore generally perpendicular to the applied electric field and the shorter dimension of the pore generally parallel to the applied electric field. The solid particles with a high aspect ratio can be applied to an electrode with or without a solid insulating coating. As in the previous method, the electrode may be etched to increase the surface area prior to coating with particles. The solid particles can be applied with any coating mechanism known in the art. The solid particles may then be mechanically or chemically fixed in position through a heating process, coating process with an additional solid insulating layer or electrode, or other methods. For example, in one embodiment, alumina flakes such as Serath from Kinsei Matec Co. or Serasu from Kawai Lime Industry Co. Ltd. may be used due to their high aspect ratio, which gives them a plate-like structure, high dielectric strength, and high dielectric constant of approximately nine. By arranging aluminum oxide flakes or platelets with the same orientation, the stack of particles will have regions of vacuum or gas between them that also have a high aspect ratio. Additional particles of smaller aspect ratio and/or different shapes (e.g., flakes and ribbons) can be included to increase the volume of the vacuum or gas regions between aluminum oxide particles. Another solid insulating coating and another electrode may be applied by sputtering, other chemical or physical deposition methods, or in the form of a solid or liquid electrolyte.

Nanolithography refers to the methods of producing structures and components at dimensions less than 1,000 nm. Nanolithography methods may be utilized to create structures at size scales relevant to the dielectric structures of embodiments of this invention. From one or more conducting or semiconducting layers, it is possible to apply thin insulation layers and leave gaps of vacuum or gas at the size scales of embodiments of this invention. Application of electrodes through nanolithography is also possible at the size scales required to make the capacitive structures of embodiments of this invention. In one embodiment, the structure may be primarily two dimensional (2D) in the form of rows of electrodes or interdigitated electrodes making capacitive structures incorporating solid insulators and vacuum/gas gaps across a surface. In another embodiment, the structure may also be three-dimensional (3D) with a form similar to the previously described layered structure or the structure incorporating plate-like pores.

Methods of Incorporating the Dielectric Structure Into Components—Since the dielectric structures of embodiments of the present invention enable operation with a very small thickness of the dielectric, the porous dielectric may not be mechanically self-supporting at very small thicknesses (e.g., less than 5 microns). The dielectric in those thin-film cases may need to be deposited on a supporting structure, such as an electrode foil or plate, for example. When deposited onto an electrode foil, the opposite electrode may be deposited onto the dielectric as a thin metallization consistent with that described previously for self-clearing. There are many electrode patterns and configurations that have previously been developed for fabricating capacitors on dielectric films. All of those may be applicable for use with the dielectric structures of embodiments of the present invention.

Figure 28:
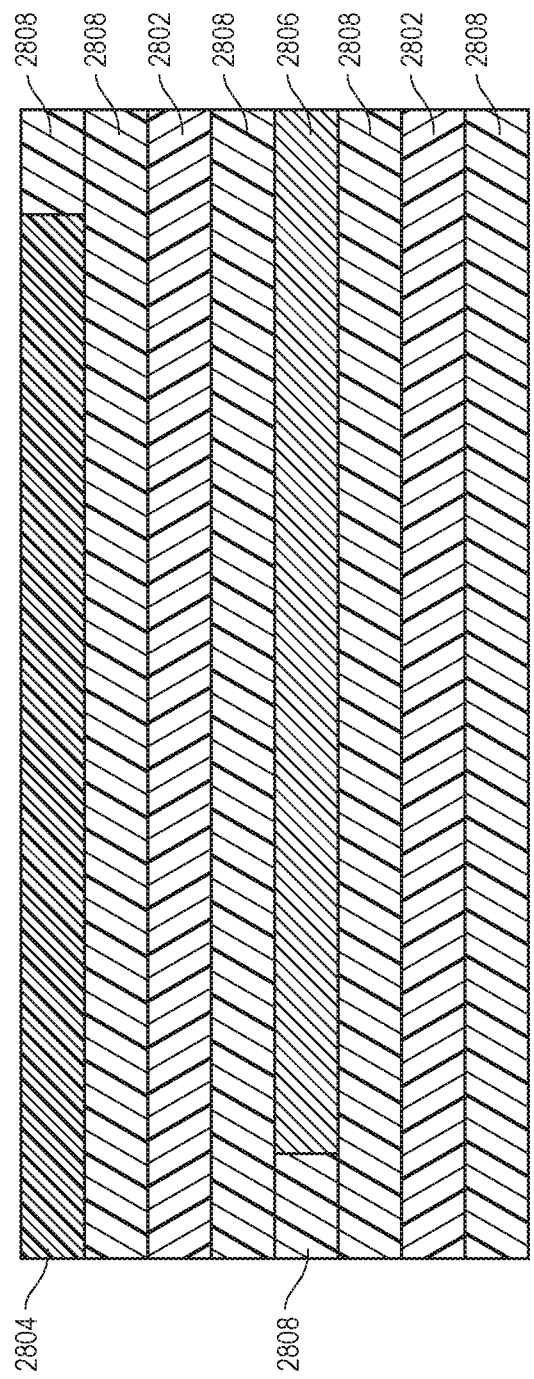
FIG. 28 is a diagram of an example structure of a capacitor layer deposited on an aluminum foil in accordance with one embodiment of the present invention.

FIG. 28 illustrates one example embodiment in which dielectric layers and a thin-film metallization are deposited on a conductive foil 2806 (e.g., aluminum foil, etc.). In FIG. 28, the thicknesses of the layers are not to scale and are only intended to show the ordering of the layers. The conductive foil 2806 first undergoes a process during which a thin solid insulator 2808 (e.g., aluminum oxide, etc.) is applied to the top and bottom surfaces. As shown in this example, the conductive foil 2806 is oxidized to produce thin layers of insulation 2808. One edge of the conductive foil 2806 is completely insulated by insulation 2808 to prevent an electrical connection to the conductive portion of the foil 2806 from that edge. On top of the solid insulating layers 2808, a layer of the porous dielectric structure 2802 is coated on both sides. This porous dielectric structure 2802 is the primary energy storage region and comprises a significant percentage of the overall thickness of the actual structure. Another solid insulating layer 2808 may be deposited on the exposed sides of the porous dielectric structure 2802. Finally, one side of the film is metallized with a thin conductive coating 2804 to form the second electrode. This second electrode may not extend all the way to the edge where the first conductive foil 2806 is exposed but may extend to the opposite edge. Alternatively, the second electrode could be formed by a second foil. With the layered film of FIG. 28, a capacitor can be fabricated by winding the film around a mandrel, for example. This arrangement enables electrical connections to the two electrodes (e.g., conductive foil 2806 and conductive coating 2804, etc.) from opposite edges of the wound capacitor. There are many variations on capacitor electrode patterns and fabrication methods known in the art. This example illustrates one way in which the porous dielectric structure of embodiments of the present invention can be implemented in a capacitor.

From the previous description, a layered film and capacitor can be formed with a processing method when starting with a supporting structure, such as a conductive electrode foil 2806. However, as the thickness of the electrodes can become a limiting factor for the energy density of the complete capacitor, alternative manufacturing methods that do not require a mechanically self-supporting structure for each layer of the capacitor are advantageous for reducing the size and weight of the complete capacitor. Methods for fabricating a multi-layered capacitor through multiple depositions on a single mechanically supporting structure provide a means of reducing the volume and weight of electrodes. An example of one such method to produce multiple layers comprises a rotating cylindrical support on which the capacitor is built up in layers. Along the circumference of the cylinder, various coating or processing equipment are placed such that as a point on the cylinder is rotated, multiple layers of the porous dielectric, solid dielectric, and electrode metallization may be applied. By controlling the metallization such that the edge of the cylinder to which the metallized electrode extends between layers of dielectric alternates, a multi-layered capacitor structure can be fabricated with only one mechanical support. The capacitor may be removed from that mechanical support after enough layers have been fabricated such that the capacitor is mechanically self-supporting. The geometry of the system for fabricating a capacitor with these methods is not limited to a rotating cylinder but could be embodied by a system with a conveyor or other system to transfer the capacitor through multiple coating, deposition, and/or processing stations. Other embodiments of these methods may include a stationary capacitor fabrication platform with the coating, deposition, or processing equipment moving over the surface of the capacitor in sequence to build the capacitor structure in a printing-like process.

Figure 29:
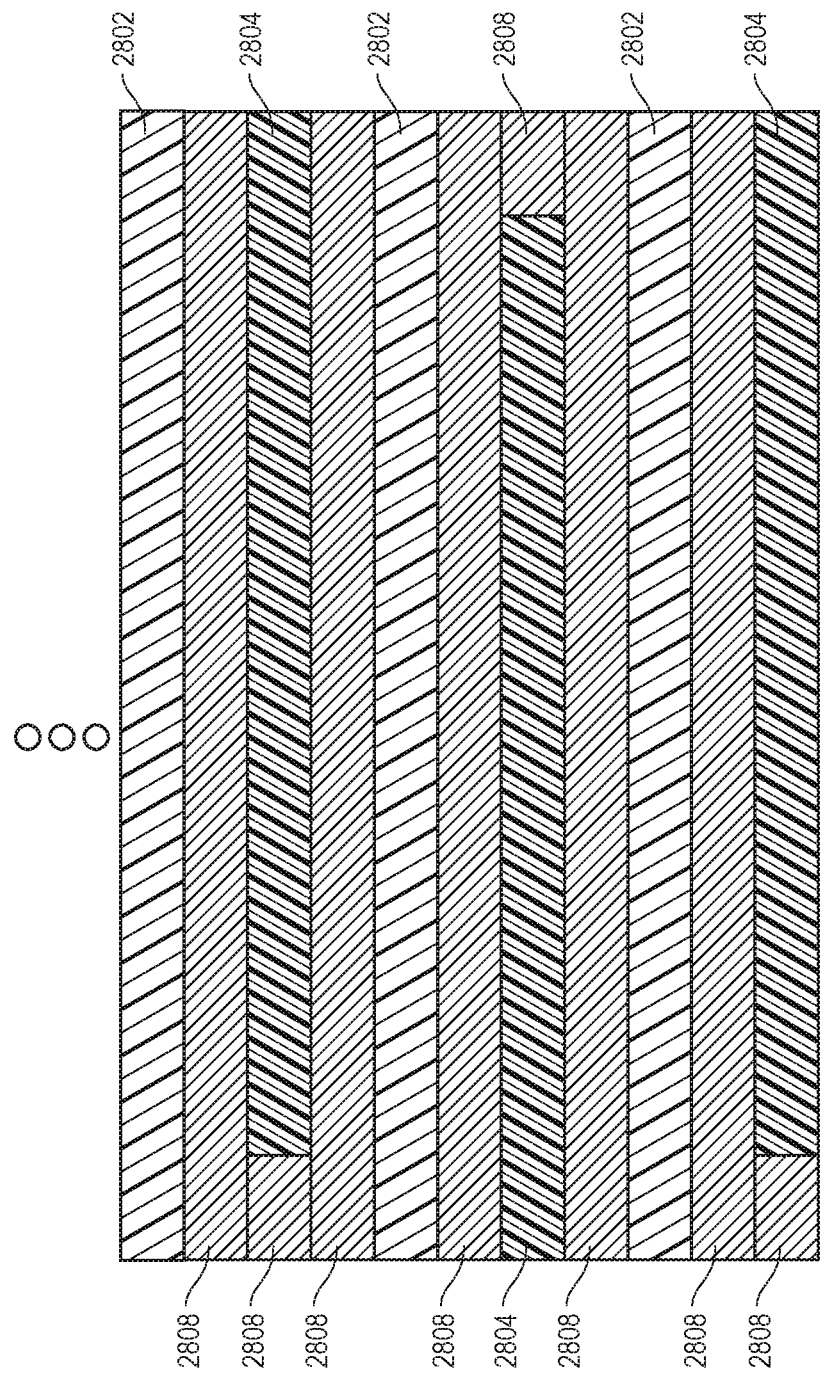
FIG. 29 is a diagram of a layered capacitor structure built onto a supporting structure in accordance with one embodiment of the present invention.

FIG. 29 shows an example embodiment of a layered structure that could be built onto a supporting structure, which is not shown, using the previously described alternative manufacturing method. This example structure incorporates only thin metallized electrode coatings (e.g., porous dielectric structure 2802, thin conductive coating 2804, solid insulating layers 2808, etc.). Additional layers could be added as needed to increase the total capacitance of the capacitor.

In an aspect, an article may comprise a dielectric structure. Exemplary articles include, but are not limited to capacitors, circuit substrates, transmission lines and cables, semiconductor devices, electronic devices, computers, televisions, smartphones, tablet computing devices, wearable computing devices, packaging, boxes, shipping containers, vehicles, stereo/audio equipment and devices, unmanned aerial vehicles (UAV) (e.g., drones), and the like. The dielectric structure includes one or more regions of at least one solid material (e.g., solid material regions 302, solid matrix 904, solid particles 1902, etc.) having a dielectric constant greater than four and a plurality of regions of vacuum or gas (e.g., vacuum or gas regions 304, vacuum or gas pores 902, vacuum or gas matrix 1904, etc.). At least one region of the one or more regions of at least one solid material has a first average particle dimension ($d_{maj}$) and a second average particle dimension ($d_{min}$). Moreover, at least one region of vacuum or gas of the plurality of regions of vacuum or gas has a first average particle dimension ($d'_{maj}$) and a second average particle dimension ($d'_{min}$). An aspect ratio of $d_{maj}$ to $d_{min}$ for the at least one region of at least one solid material is equal to or greater than four and/or an aspect ratio of $d'_{maj}$ to $d'_{min}$ for the at least one region of vacuum or gas is equal to or greater than four. The plurality of regions of vacuum or gas are dispersed throughout the one or more regions of at least one solid material such that, upon application of an electric field (E) to the dielectric structure, the average electric field in the one or more regions of at least one solid material is less than the average electric field in the plurality of regions of vacuum or gas.

In another aspect, the article may further include one or more electrodes (e.g., electrodes 306, electrodes 906, electrodes 1906, etc.). In an embodiment, the dielectric structure described above and the one or more electrodes together comprise a capacitive structure (e.g., capacitive structure 300, composite structure 900, composite structure 900', etc.).

In yet another aspect, the article may further include two or more terminals for electrical connection to the one or more electrodes. In an embodiment, the capacitive structure described above and the two or more terminals together comprise a capacitor.

In another aspect, the article may further include at least one transmission line that is comprised of at least two conductors. In an embodiment, the capacitive structure described above and the at least one transmission line together comprise a circuit substrate.

In yet another aspect, the article may further include at least one cable that is comprised of at least two conductors.

From the foregoing, it will be seen that this invention is one well adapted to attain all the ends and objects hereinabove set forth together with other advantages which are inherent to the structure and method. It will be understood that certain features and sub combinations are of utility and may be employed without reference to other features and sub combinations. This is contemplated by and is within the scope of the claims. Since many possible embodiments of the invention may be made without departing from the scope thereof, it is also to be understood that all matters herein set forth or shown in the accompanying drawings are to be interpreted as illustrative and not limiting.

The constructions described above and illustrated in the drawings are presented by way of example only and are not intended to limit the concepts and principles of the present invention. Thus, there has been shown and described several embodiments of a novel invention. As is evident from the foregoing description, certain aspects of the present invention are not limited by the particular details of the examples illustrated herein, and it is therefore contemplated that other modifications and applications, or equivalents thereof, will occur to those skilled in the art. The terms "having" and "including" and similar terms as used in the foregoing specification are used in the sense of "optional" or "may include" and not as "required". Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. An article, comprising:
    a dielectric structure comprising:
        one or more regions of at least one solid material having a dielectric constant greater than four, wherein at least one region of the one or more regions of at least one solid material has a first average particle dimension ($d_{maj}$) and a second average particle dimension ($d_{min}$); and
        a plurality of regions of vacuum or gas, wherein at least one region of vacuum or gas of the plurality of regions of vacuum or gas has a first average particle dimension ($d'_{maj}$) and a second average particle dimension ($d'_{min}$);
    wherein at least one of:
        an aspect ratio of $d_{maj}$ to $d_{min}$ for the at least one region of at least one solid material is equal to or greater than four; and
        an aspect ratio of $d'_{maj}$ to $d'_{min}$ for the at least one region of vacuum or gas is equal to or greater than four, and
    wherein the plurality of regions of vacuum or gas are dispersed throughout the one or more regions of at least one solid material such that, upon application of an electric field to the dielectric structure, the average electric field in the one or more regions of at least one solid material is less than the average electric field in the plurality of regions of vacuum or gas.

2. The article of claim 1, wherein the one or more regions of solid of at least one solid material is comprised of a three-dimensional network of one or more solid insulators.

3. The article of claim 1, wherein the volume of the plurality of regions of vacuum or gas is between about 10% and about 99% of the total volume of the one or more regions of at least one solid material and the plurality of regions of vacuum or gas.

4. The article of claim 1, wherein the aspect ratio of $d'_{maj}$ to $d'_{min}$ for each region of vacuum or gas is less than or equal to about 1000.

5. The article of claim 1, wherein the at least one solid material is at least one of a metal oxide, diamond, or nitride.

6. The article of claim 1, wherein the at least one solid material is at least one of alumina, diamond, tantalum oxide, hafnia, niobia, titania, silica, silicon nitride, boron nitride, or aluminum nitride.

7. The article of claim 1, wherein the gas is comprised of one or more of air, nitrogen, sulfur hexafluoride, oxygen, hydrogen, carbon dioxide, perfluorocarbons, or chlorofluorocarbons.

8. The article of claim 1, wherein the second average particle dimension ($d'_{min}$) of the at least one region of vacuum or gas of the plurality of regions of vacuum or gas is 1 micron or less.

9. The article of claim 1, wherein the second average particle dimension ($d_{min}$) of the at least one region of at least one solid material is 1 micron or less.

10. The article of claim 1, further comprising one or more electrodes.

11. The article of claim 10, wherein at least one of the electrodes is coated with an insulating layer on a surface thereof adjacent to the dielectric structure.

12. The article of claim 11, wherein the insulating layer is at least one of alumina, diamond, tantalum oxide, hafnia, niobia, titania, silica, aluminum nitride, or boron nitride.

13. The article of claim 11, wherein the insulating layer is formed from oxidation, anodization, or other chemical reaction of the at least one electrode.

14. The article of claim 11, wherein the at least one electrode coated with the insulating layer comprises a cathode of a unipolar device.

15. The article of claim 11, wherein electrically conducting and insulating layers of the dielectric structure comprise more than one electrode of a bipolar device.

16. The article of claim 11, wherein the insulating layer is less than about 10% of the total thickness of insulating layers and the dielectric structure.

17. The article of claim 10, wherein the one or more electrodes are comprised of an electrode conductor, and wherein the electrode conductor is a metal, a semiconductor material, a liquid electrolyte, or a solid electrolyte.

18. The article of claim 10, wherein the one or more electrodes are comprised of an electrode conductor, and wherein the electrode conductor is at least one of aluminum, carbon, hafnium, niobium, silicon, titanium, nickel, silver, gold, or tantalum.

19. The article of claim 10, wherein the average electric field in the plurality of regions of vacuum or gas is greater than about 1 GV/m.

20. The article of claim 10, further comprising two or more terminals for electrical connection to the one or more electrodes.

21. The article of claim 10, further comprising at least one transmission line, wherein the at least one transmission line is comprised of at least two conductors.

22. The article of claim 10, wherein the gas aids in a vaporization, an oxidation, or other reaction of at least one of:

the one or more electrodes and the one or more regions of at least one solid material, to limit an electrical current during or after a dielectric failure.

* * * * *